US010263046B2

United States Patent
Hashimoto

(10) Patent No.: US 10,263,046 B2
(45) Date of Patent: Apr. 16, 2019

(54) ORGANIC EL DISPLAY PANEL AND METHOD OF MANUFACTURING ORGANIC EL DISPLAY PANEL

(71) Applicant: JOLED INC., Tokyo (JP)

(72) Inventor: Jun Hashimoto, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/635,994

(22) Filed: Jun. 28, 2017

(65) Prior Publication Data
US 2018/0090546 A1    Mar. 29, 2018

(30) Foreign Application Priority Data

Sep. 28, 2016 (JP) ................................. 2016-190030

(51) Int. Cl.
| | | |
|---|---|---|
| H01L 27/32 | (2006.01) | |
| H01L 51/00 | (2006.01) | |
| H01L 51/50 | (2006.01) | |
| H01L 51/52 | (2006.01) | |
| H01L 51/56 | (2006.01) | |

(52) U.S. Cl.
CPC ...... *H01L 27/3211* (2013.01); *H01L 27/3246* (2013.01); *H01L 51/0005* (2013.01); *H01L 51/5056* (2013.01); *H01L 51/5088* (2013.01); *H01L 51/5221* (2013.01); *H01L 51/56* (2013.01)

(58) Field of Classification Search
CPC .............. H01L 27/3211; H01L 27/3246; H01L 51/0005; H01L 51/5056; H01L 51/5088; H01L 51/5221; H01L 51/56
See application file for complete search history.

(56) References Cited

U.S. PATENT DOCUMENTS

| | | | |
|---|---|---|---|
| 5,443,922 A | 8/1995 | Nishizaki et al. | |
| 2006/0279190 A1 | 12/2006 | Nakayama | |
| 2007/0244320 A1* | 10/2007 | Inoue ................... | C07F 15/0033 544/225 |
| 2013/0234129 A1* | 9/2013 | Yamada .............. | H01L 51/5265 257/40 |
| 2017/0117333 A1* | 4/2017 | Kikuchi ................... | G09F 9/30 |

FOREIGN PATENT DOCUMENTS

| | | |
|---|---|---|
| JP | 05163488 A | 6/1993 |
| JP | 2007005784 A | 1/2007 |
| JP | 2010123716 A | 6/2010 |
| WO | 2012073269 A1 | 6/2012 |

* cited by examiner

*Primary Examiner* — Joseph M Galvin, III
(74) *Attorney, Agent, or Firm* — Chip Law Group

(57) ABSTRACT

An organic EL display panel having a plurality of pixels arranged, the pixels each including blue, green and red sub-pixels, includes: a substrate; a first pixel electrode layer, a first hole injection layer, a first hole transport layer and a blue organic light-emitting layer provided in regions of the blue sub-pixels over the substrate in this order from the substrate side; a second pixel electrode layer, a second hole injection layer, a second hole transport layer and a green organic light-emitting layer provided in regions of the green sub-pixels over the substrate in this order from the substrate side; a third pixel electrode layer, a third hole injection layer, a third hole transport layer and a red organic light-emitting layer provided in regions of the red sub-pixels over the substrate in this order from the substrate side; and a counter electrode layer provided over the blue, green and red organic light-emitting layers.

11 Claims, 12 Drawing Sheets

ORGANIC EL DISPLAY PANEL AND METHOD OF MANUFACTURING ORGANIC EL DISPLAY PANEL

CROSS REFERENCE TO RELATED APPLICATIONS

This application claims priority benefit of Japanese Patent Application No. JP 2016-190030 filed in the Japan Patent Office on Sep. 28, 2016. Each of the above-referenced applications is hereby incorporated herein by reference in its entirety.

BACKGROUND

The present disclosure relates to an organic electroluminescence (EL) display panel in which organic EL elements utilizing an electroluminescence phenomenon of an organic material are used, and a method of manufacturing the same.

In recent years, as display panels for use in display apparatuses such as digital television sets, organic EL display panels in which a plurality of organic EL elements are arranged in a matrix pattern on a substrate have been put to practical use.

In an organic EL display panel, generally, a light-emitting layer of each organic EL element and those of the adjacent organic EL elements are partitioned by an insulating layer formed of an insulating material. In an organic EL display panel for color display, the organic EL elements constitute sub-pixels that each emit light in red (R), green (G) or blue (B), and the adjacent RGB sub-pixels are combined together to form a unit pixel in color display.

The organic EL element has a basic structure in which a light-emitting layer containing an organic light-emitting material is disposed between a pair of electrodes, namely, an anode and a cathode. At the time of driving, a voltage is impressed between the pair of electrodes, and holes injected into the light-emitting layer from the anode and electrons injected into the light-emitting layer from the cathode are brought into recombination, whereby light is emitted. In a top emission type organic EL element, the light from the light-emitting layer is reflected by the anode which is formed of a light-reflecting material and is emitted to the upper side from the cathode which is formed of a light-transmitting material.

For enhancing the light emission efficiency of the organic EL element, it is important to efficiently inject the carriers (holes and electrons) from the electrodes into the functional layer. For efficient injection of the carriers, in general, it is effective to provide an injection layer for lowering the energy barrier at the time of injection (injection barrier), between each electrode and the functional layer. For instance, in relation to a top emission type organic EL element, there has been proposed a technology in which a plurality of hole injection layers are provided between the anode and the light-emitting layer to enhance the hole injection property from the anode into the light-emitting layer, thereby improving the life characteristic of the organic EL element (see, for example, Japanese Patent Laid-open No. 2007-5784).

SUMMARY

However, the carrier density required according to the characteristics of the light-emitting layer is different for the different ones of the color sub-pixels that emit light in respective RGB colors. According to the conventional configuration wherein the hole injection layers in the RGB sub-pixels have the same structure, therefore, there may arise a problem that a sufficient emission luminance cannot be obtained at the light-emitting layers for each color, or the voltage impressed on one or some of the RGB sub-pixels becomes excessively high, leading to a lowered element life.

In addition, in the top emission type organic EL element, in order to enhance the color purity of the emitted light and thereby to enhance the emission luminance, it is necessary to differentiate the anode-cathode distance on the basis of each sub-pixel for emitting light in each of RGB colors, and thereby to adopt an optical resonator structure between the anode and the cathode, thereby enhancing the light extraction efficiency.

Thus, there is a need for an organic EL display panel wherein emission luminance and light extraction efficiency of organic EL elements are enhanced and element life is improved, and for a manufacturing method suitable for manufacturing such an organic EL display panel.

In accordance with a mode of the present disclosure, there is provided an organic EL display panel having a plurality of pixels arranged, the pixels each including a blue sub-pixel, a green sub-pixel and a red sub-pixel, the organic EL display panel including: a substrate; a first pixel electrode layer, a first hole injection layer, a first hole transport layer and a blue organic light-emitting layer provided in regions of the blue sub-pixels over the substrate in this order from the substrate side; a second pixel electrode layer, a second hole injection layer, a second hole transport layer and a green organic light-emitting layer provided in regions of the green sub-pixels over the substrate in this order from the substrate side; a third pixel electrode layer, a third hole injection layer, a third hole transport layer and a red organic light-emitting layer provided in regions of the red sub-pixels over the substrate in this order from the substrate side; and a counter electrode layer provided over the blue organic light-emitting layer, the green organic light-emitting layer and the red organic light-emitting layer. In the organic EL display panel, the first hole injection layer includes a first lower layer made of a metallic oxide and a first upper layer made of an organic material stacked on the first lower layer, the second hole injection layer includes a second lower layer made of the metallic oxide and a second upper layer made of the organic material stacked on the second lower layer, and the third hole injection layer includes a third lower layer made of the metallic oxide and a third upper layer made of the organic material stacked on the third lower layer, the third upper layer being greater in thickness than the first upper layer and the second upper layer.

In the organic EL display panel according to the described mode, the emission luminance and light extraction efficiency of the organic EL elements can be enhanced, and the element life can be improved.

DETAILED DESCRIPTION OF THE PREFERRED EMBODIMENTS

Outline of Embodiment of Present Disclosure

Figure 1:
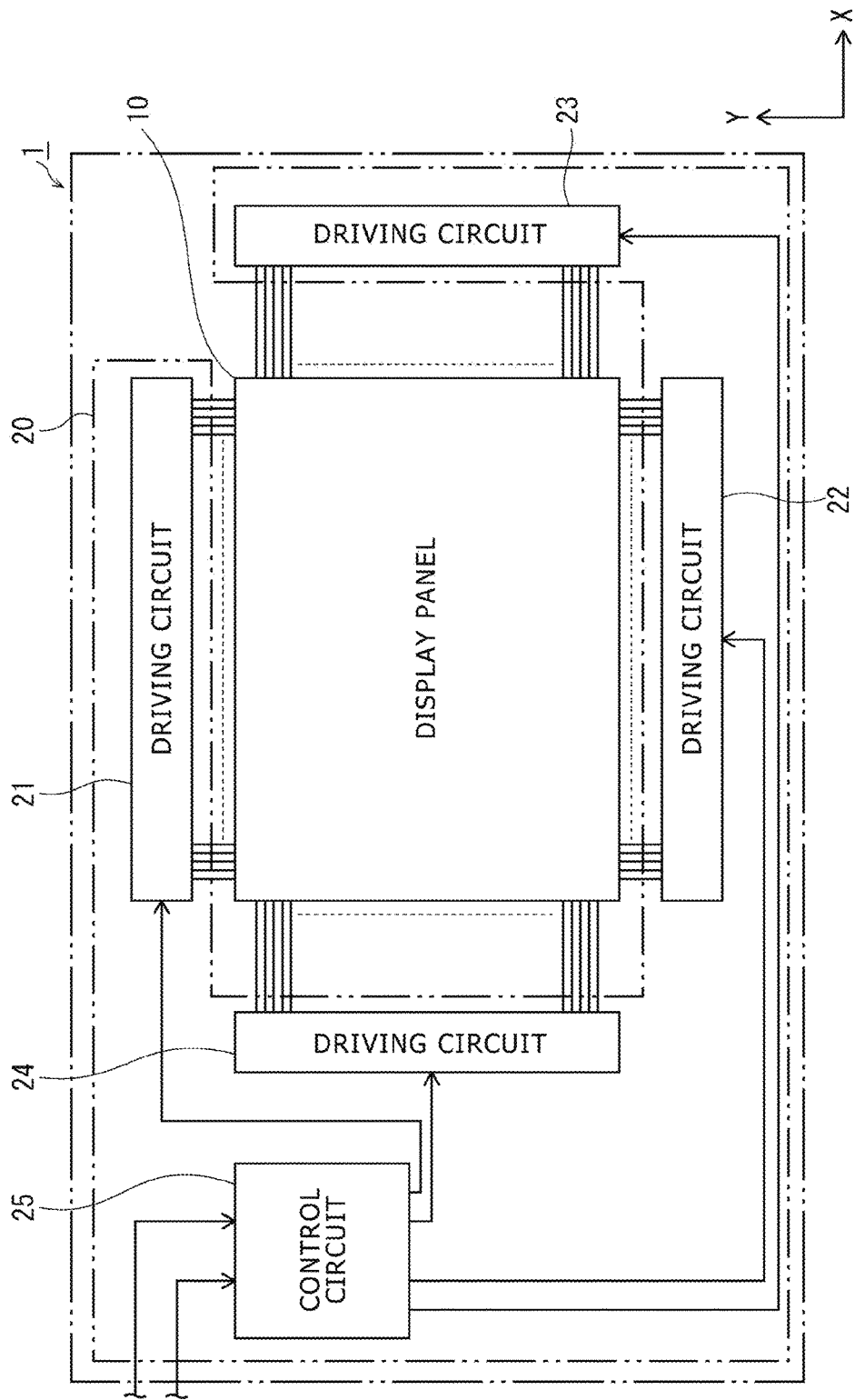
FIG. 1 is a schematic block diagram showing a circuit configuration of an organic EL display apparatus according to an embodiment of the present disclosure.

An organic EL display panel in accordance with an embodiment of the present disclosure is an organic EL display panel having a plurality of pixels arranged, the pixels each including a blue sub-pixel, a green sub-pixel and a red sub-pixel. The organic EL display panel includes: a substrate; a first pixel electrode layer, a first hole injection layer, a first hole transport layer and a blue organic light-emitting layer provided in regions of the blue sub-pixels over the substrate in this order from the substrate side; a second pixel electrode layer, a second hole injection layer, a second hole transport layer and a green organic light-emitting layer provided in regions of the green sub-pixels over the substrate in this order from the substrate side; a third pixel electrode layer, a third hole injection layer, a third hole transport layer and a red organic light-emitting layer provided in regions of the red sub-pixels over the substrate in this order from the substrate side; and a counter electrode layer provided over the blue organic light-emitting layer, the green organic light-emitting layer and the red organic light-emitting layer, wherein the first hole injection layer includes a first lower layer made of a metallic oxide and a first upper layer made of an organic material stacked on the first lower layer, the second hole injection layer includes a second lower layer made of the metallic oxide and a second upper layer made of the organic material stacked on the second lower layer, and the third hole injection layer includes a third lower layer made of the metallic oxide and a third upper layer made of the organic material stacked on the third lower layer, the third upper layer being greater in thickness than the first upper layer and the second upper layer.

This configuration makes it possible to enhance emission luminance and light extraction efficiency of the organic EL element and to improve element life.

In addition, in another mode, in the above configuration, a configuration may be adopted wherein the thickness of the first upper layer is more than 0 nm and not more than 25 nm, the thickness of the second upper layer is more than 0 nm and not more than 30 nm, and the thickness of the third upper layer is 20 to 50 nm.

According to this configuration, the light-emitting layers are driven by optimum voltages corresponding to carrier densities necessary for driving on each emission color basis, so that a sufficient emission luminance can be obtained at each light-emitting layer.

Furthermore, in a resonator structure, the film thickness of the upper layer of the hole injection layer can easily be appropriately set in such a manner that an optical film thickness is adjusted to an optical film thickness which gives a maximum light extraction efficiency, so that light extraction efficiency can be enhanced.

Besides, in a further mode, in any of the above configurations, the organic material may include a mixture of polythiophene and polystyrenesulfonic acid.

According to this configuration, the upper layer is formed by an applying system such as an ink jet method, and, in the applying system, it is possible, by varying the amount of the ink jetted from nozzles, to comparatively easily control the film thickness depending on the film formation parts, even in the case of forming films on the same substrate.

In yet another mode, in any of the above configurations, the first lower layer, the second lower layer and the third lower layer may be the same in thickness.

According to this configuration, it is unnecessary to perform film formation and patterning for the lower layers separately while using shadow masks, so that an increase in cycle time on a manufacturing process basis and an increase in cost on a mass production basis can be obviated.

In a yet further mode, in any of the above configurations, the first lower layer, the second lower layer and the third lower layer may be 5 to 20 nm in thickness.

In still another mode, in any of the above configurations, the metallic oxide may include an oxide of tungsten (W).

According to this configuration, the lower layer can be formed by sputtering or vapor phase growth such as vacuum deposition. The forming method for the lower layer includes a method of forming a film of a metal followed by baking and a method of forming a metallic oxide film directly, either of which may be used so long as the intended effect is not hindered.

From the viewpoint of adhesion of the lower layer to the upper layer, it is desirable to form a film of a metal and thereafter bake the metallic film.

In a still further mode, in any of the above configurations, the organic EL display panel may further include a bank arranged over the substrate for partitioning the regions of the blue sub-pixels, the green sub-pixels and the red sub-pixels, and the bank may include: a plurality of column banks arranged at least over row-directionally outer edges of the first, second and third pixel electrode layers and over the substrate located between the row-directionally outer edges; and a plurality of row banks arranged at least over column-directionally outer edges of the first pixel electrode layer, the second pixel electrode layer or the third pixel electrode layer and over the substrate located between the column-directionally outer edges. In addition, in another mode, in any of the above configurations, the first upper layer, the second upper layer and the third upper layer may be arranged continuously in the column direction over the row banks.

According to this configuration, in the display panel manufactured by applying an ink containing a material for hole injection layer to the inside of column-shaped application regions on a substrate, the flow in the column direction of the ink containing an organic compound as the material for the hole injection layer in gaps between the column banks can be controlled, whereby the uniformity of film thickness of the hole injection layers in the column-shaped application regions can be enhanced, variations in hole injection property can be restrained, and unevenness of luminance can be improved.

In a further mode, in any of the above configurations, the blue light-emitting layer, the green light-emitting layer and the red light-emitting layer may be arranged continuously in the column direction over the row banks.

According to this configuration, the flow in the column direction of the ink containing an organic compound as the material for the light-emitting layer in gaps between the column banks can be controlled, whereby uniformity of film thickness of the light-emitting layers in the column-shaped application regions can be enhanced, and unevenness of luminance can be improved.

In yet another mode, in any of the above configurations, the organic EL display panel may further include the hole transport layers arranged in gaps between the adjacent column banks over at least the first hole injection layer, the second hole injection layer or the third hole injection layer. In a yet further mode, in any of the above configurations, the hole transport layers may be arranged continuously in the column direction over the row banks.

According to such a configuration as just-mentioned, the flow in the column direction of the ink containing an organic compound as the material for the hole transport layer in gaps between the column banks can be controlled, whereby uniformity of film thickness of the hole transport layers in the column-shaped application regions can be enhanced, and unevenness of luminance can be improved.

A method of manufacturing an organic EL display panel in accordance with another embodiment of the present disclosure is a method of manufacturing an organic EL display panel having a plurality of pixels arranged, the pixels each including a blue sub-pixel, a green sub-pixel and a red sub-pixel, the method including: preparing a substrate; forming by vapor phase growth a first pixel electrode layer in formation regions of the blue sub-pixels over the substrate, a second pixel electrode layer in formation regions of the green sub-pixels over the substrate, and a third pixel electrode layer in formation regions of the red sub-pixels over the substrate; depositing a metal on the first pixel electrode layer, the second pixel electrode layer and the third pixel electrode layer by vapor phase growth, and thereafter performing baking to form a first lower layer, a second lower layer and a third lower layer, respectively; applying an ink containing an organic material onto at least the first lower layer, the second lower layer and the third lower layer, and thereafter performing baking to form a first upper layer, a second upper layer, and a third upper layer greater in thickness than the first upper layer and the second upper layer, respectively; applying an ink containing a material for a blue organic light-emitting layer, an ink containing a material for a green organic light-emitting layer, and an ink containing a material for a red organic light-emitting layer respectively onto at least the first upper layer, the second upper layer and the third upper layer, and thereafter performing baking to form the blue organic light-emitting layer, the green organic light-emitting layer and the red organic light-emitting layer; and forming a counter electrode layer over the blue organic light-emitting layer, the green organic light-emitting layer and the red organic light-emitting layer.

According to this configuration, it is possible to enhance emission luminance and light extraction efficiency of the organic EL element, and to manufacture an organic EL display panel in which element life is improved.

Besides, the upper layer is formed by use of an applying system such as an ink jet method, and the applying system makes it possible, by varying the amount of the ink jetted from nozzles, to comparatively easily control the film thickness according to the film formation parts even in the case of forming films on the same substrate. It is possible, therefore, to obviate the rise in cost due to material loss and the lowering in productivity attendant on highly accurate aligning of precision masks mentioned above.

In addition, in another mode, the above method of manufacturing the organic EL display panel may further include, after forming the first pixel electrode layer, the second pixel electrode layer and the third pixel electrode layer, forming a plurality of column banks at least over row-directionally outer edges of the first pixel electrode layer, the second pixel electrode layer and the third pixel electrode layer and over the substrate located between the row-directionally outer edges and forming a plurality of row banks at least over column-directionally outer edges of the first pixel electrode layer, the second pixel electrode layer and the third pixel electrode layer and over the substrate located between the column-directionally outer edges, wherein in forming the first upper layer, the second upper layer and the third upper layer, an ink containing the organic material is applied continuously in the column direction over the row banks in gaps between adjacent ones of the column banks.

By this configuration, the flow in the column direction of the ink containing an organic compound as the material for the hole injection layer in the gaps between the column banks can be controlled, whereby uniformity of film thickness of the hole injection layers in column-shaped application regions can be enhanced, variations of hole injection property can be restrained, and unevenness of luminance can be improved.

In a further mode, in any of the above configurations, the method of manufacturing the organic EL display panel may further include after forming the first upper layer, the second upper layer and the third upper layer, applying an ink containing a material for a hole transport layer onto at least the first upper layer, the second upper layer and the third upper layer, and thereafter performing baking to form a first hole transport layer, a second hole transport layer and a third hole transport layer, respectively.

By this configuration, the flow in the column direction of the ink containing an organic compound as the material for the hole transport layer in the gaps between the column banks can be controlled, whereby uniformity of film thickness of the hole transport layers in column-shaped application regions can be enhanced, and unevenness of luminance can be improved.

A method of manufacturing an organic EL display in accordance with a further embodiment of the present disclosure is a method of manufacturing an organic EL display panel having a plurality of pixels arranged, the pixels each including a blue sub-pixel, a green sub-pixel and a red sub-pixel, the method including: preparing a substrate; forming by vapor phase growth a first pixel electrode layer in formation regions of the blue sub-pixels over the substrate, a second pixel electrode layer in formation regions of the green sub-pixels over the substrate, and a third pixel electrode layer in formation regions of the red sub-pixels over the substrate; depositing a metallic oxide on the first pixel electrode layer, the second pixel electrode layer and the third pixel electrode layer by vapor phase growth to form a first lower layer, a second lower layer and a third lower layer, respectively; applying an ink containing an organic material onto at least the first lower layer, the second lower layer and the third lower layer, and thereafter performing baking to form a first upper layer, a second upper layer, and a third upper layer greater in thickness than the first upper layer and the second upper layer, respectively; applying an ink containing a material for a blue organic light-emitting layer, an ink containing a material for a green organic light-emitting layer, and an ink containing a material for a red organic light-emitting layer respectively onto at least the first upper layer, the second upper layer and the third upper layer, and thereafter performing baking to form the blue organic light-emitting layer, the green organic light-emitting layer and the red organic light-emitting layer; and forming a counter electrode layer over the blue organic light-emitting layer, the green organic light-emitting layer and the red organic light-emitting layer.

Embodiment

1. Circuit Configuration of Display Apparatus 1

A circuit configuration of an organic EL display apparatus according to an embodiment of the present disclosure (hereinafter referred to as "display apparatus 1") will now be described below, referring to FIG. 1.

As shown in FIG. 1, the display apparatus 1 includes an organic EL display panel 10 (hereinafter referred to as "display panel 10") and a driving control circuit section 20 connected thereto.

The display panel 10 is an organic EL panel which utilizes an electroluminescence phenomenon of an organic material, and in which a plurality of organic EL elements are arranged, for example, in a matrix pattern. The driving control circuit section 20 includes four driving circuits 21 to 24 and a control circuit 25.

Note that in the display apparatus 1, the layout configuration of the circuits of the driving control circuit section 20 in relation to the display panel 10 is not limited to the configuration shown in FIG. 1.

2. Circuit Configuration of Display Panel 10

The plurality of organic EL elements in the display panel 10 are each composed of a unit pixel 100e including sub-pixels (not shown) 100se for three colors that emit light in respective RGB colors. A circuit configuration of each sub-pixel 100se will be described referring to FIG. 2.

Figure 2:
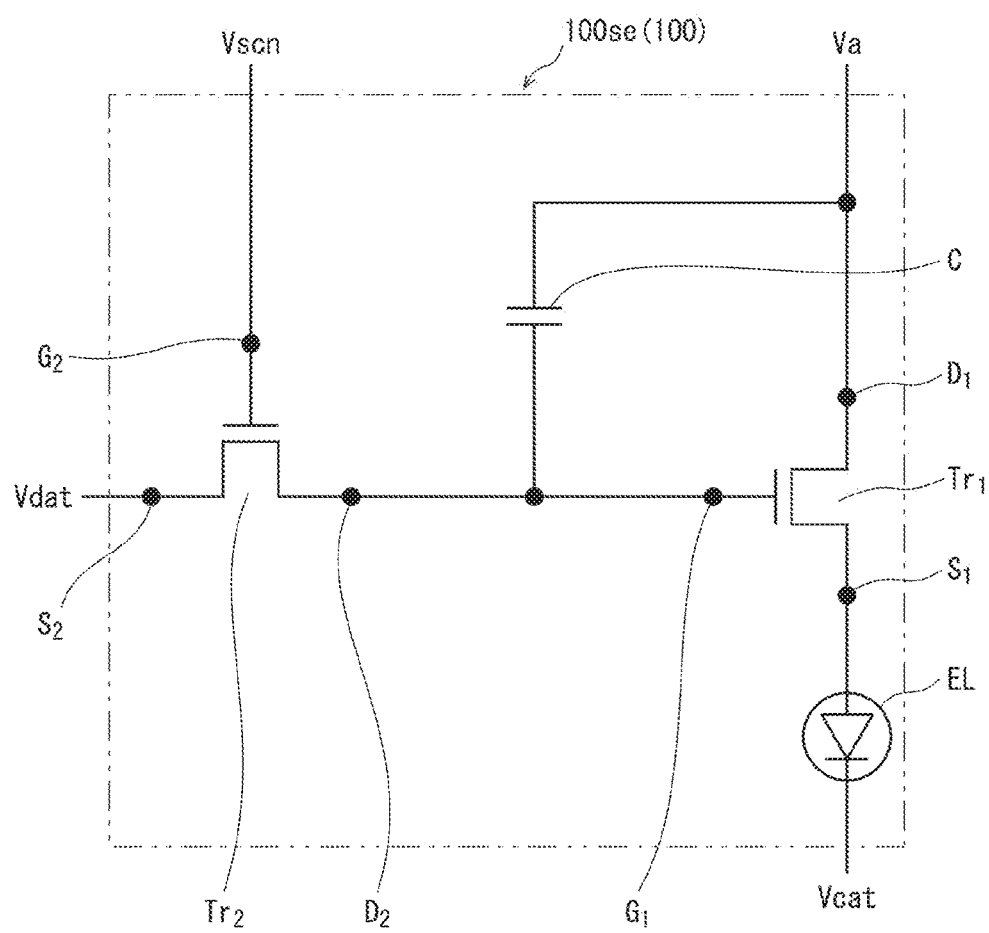
FIG. 2 is a schematic circuit diagram showing a circuit configuration of each sub-pixel of an organic EL display panel used in the organic EL display apparatus.

FIG. 2 is a schematic circuit diagram showing the circuit configuration in the organic EL element 100 corresponding to each sub-pixel 100se of the display panel 10 used for the display apparatus 1. In the display panel 10, the organic EL elements 100 constituting the unit pixels 100e are arranged in a matrix pattern, to constitute a display region.

As illustrated in FIG. 2, in the display panel 10 according to the present embodiment, each sub-pixel 100se includes two transistors Tr1 and Tr2, one capacitance C, and an organic EL element section EL as a light-emitting section. The transistor Tr1 is a driving transistor, and the transistor Tr2 is a switching transistor.

A gate G2 of the switching transistor Tr2 is connected to a scanning line Vscn, and its source S2 is connected to a data line Vdat. A drain D2 of the switching transistor Tr2 is connected to a gate G1 of the driving transistor Tr1.

A drain D1 of the driving transistor Tr1 is connected to a power supply line Va, and its source S1 is connected to a pixel electrode layer (anode) of the organic EL element section EL. A counter electrode layer (cathode) of the organic EL element section EL is connected to a ground line Vcat.

Note that the capacitance C is provided in such a manner that the drain D2 of the switching transistor Tr2 and the gate G1 of the driving transistor Tr1 are connected to the power supply line Va therethrough.

In the display panel 10, a plurality of adjacent sub-pixels 100se (for example, three sub-pixels 100se for luminescent colors of RGB) are combined to constitute one unit pixel 100e, and such unit pixels 100e are arranged in a distribution to constitute a pixel region. Gate lines GL are extended from the respective gates G2 of the sub-pixels 100se, and are connected to the scanning line Vscn which is connected from outside of the display panel 10. Similarly, source lines SL are extended from the respective sources S2 of the sub-pixels 100se, and are connected to the data line Vdat which is connected from outside of the display panel 10.

In addition, power supply lines Va of the sub-pixels 100se and ground lines Vcat of the sub-pixels 100se are together connected to the power supply line Va and to the ground line Vcat.

3. General Configuration of Display Panel 10

The display panel 10 according to the present embodiment will be described referring to the drawings. Note that the drawings are schematic drawings, and reduction scales used therein may not reflect the actual sizes.

Figure 3:
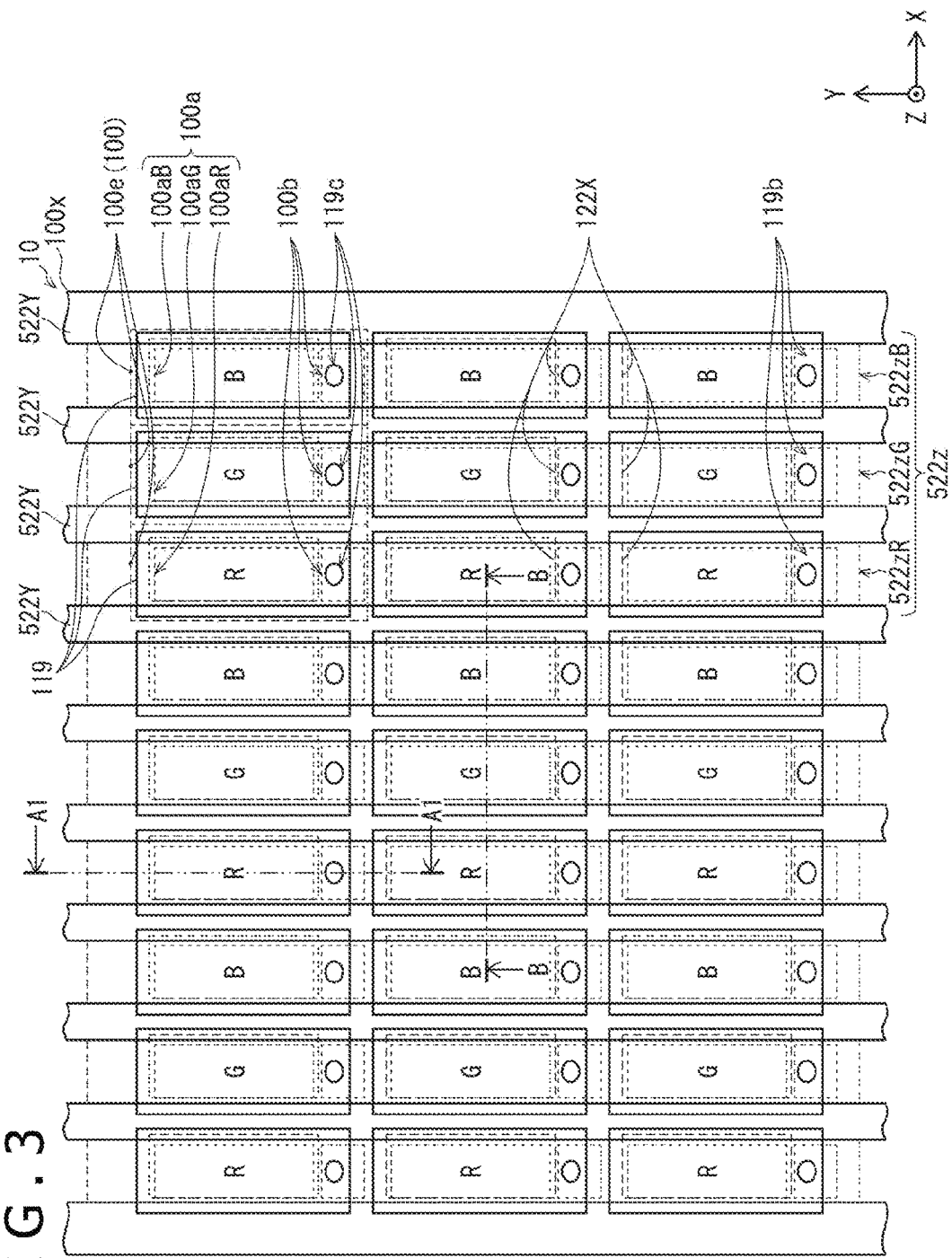
FIG. 3 is a schematic plan view showing a part of the organic EL display panel.
Figure 4:
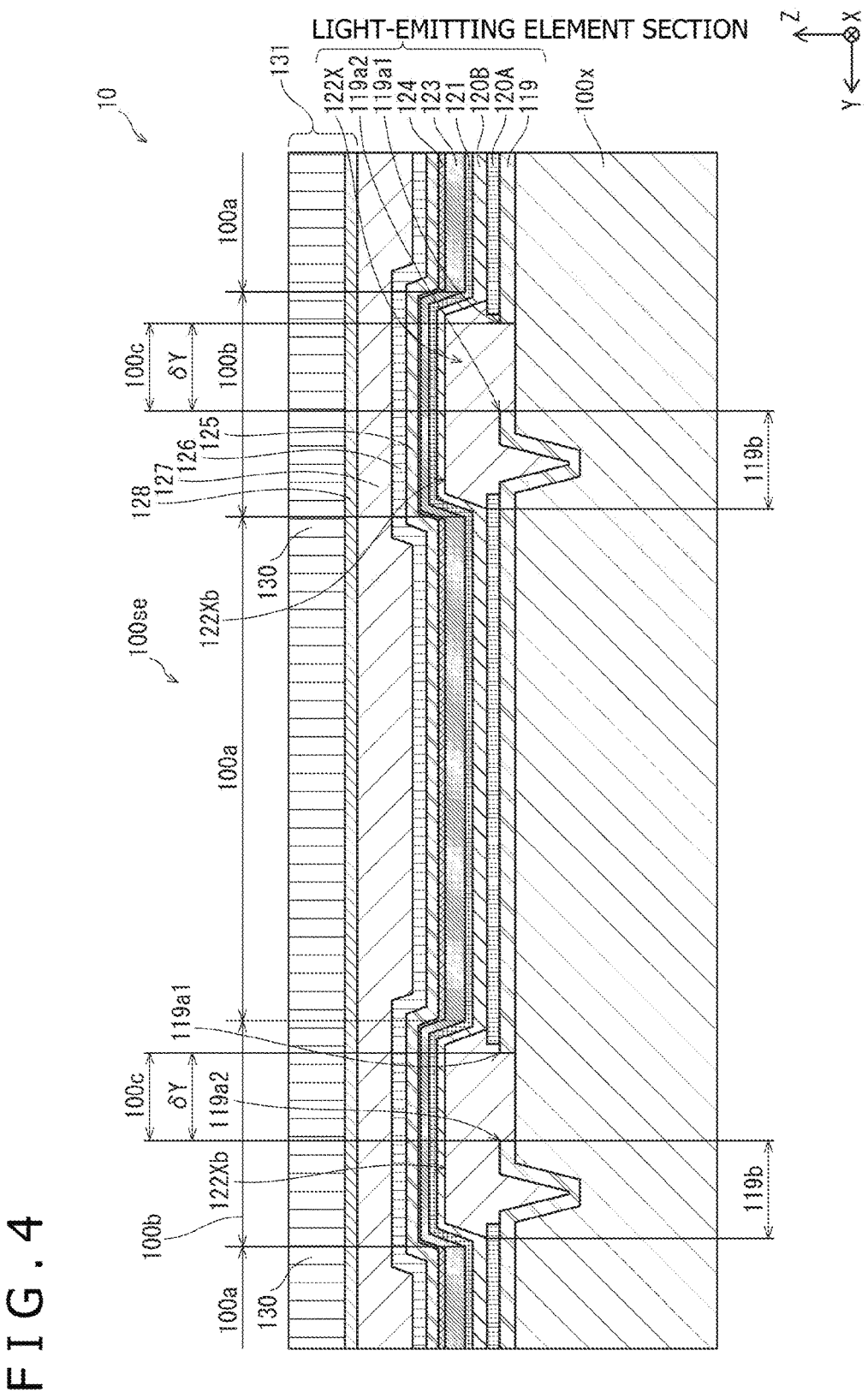
FIG. 4 is a schematic sectional view taken along line A-A of FIG. 3.
Figure 5:
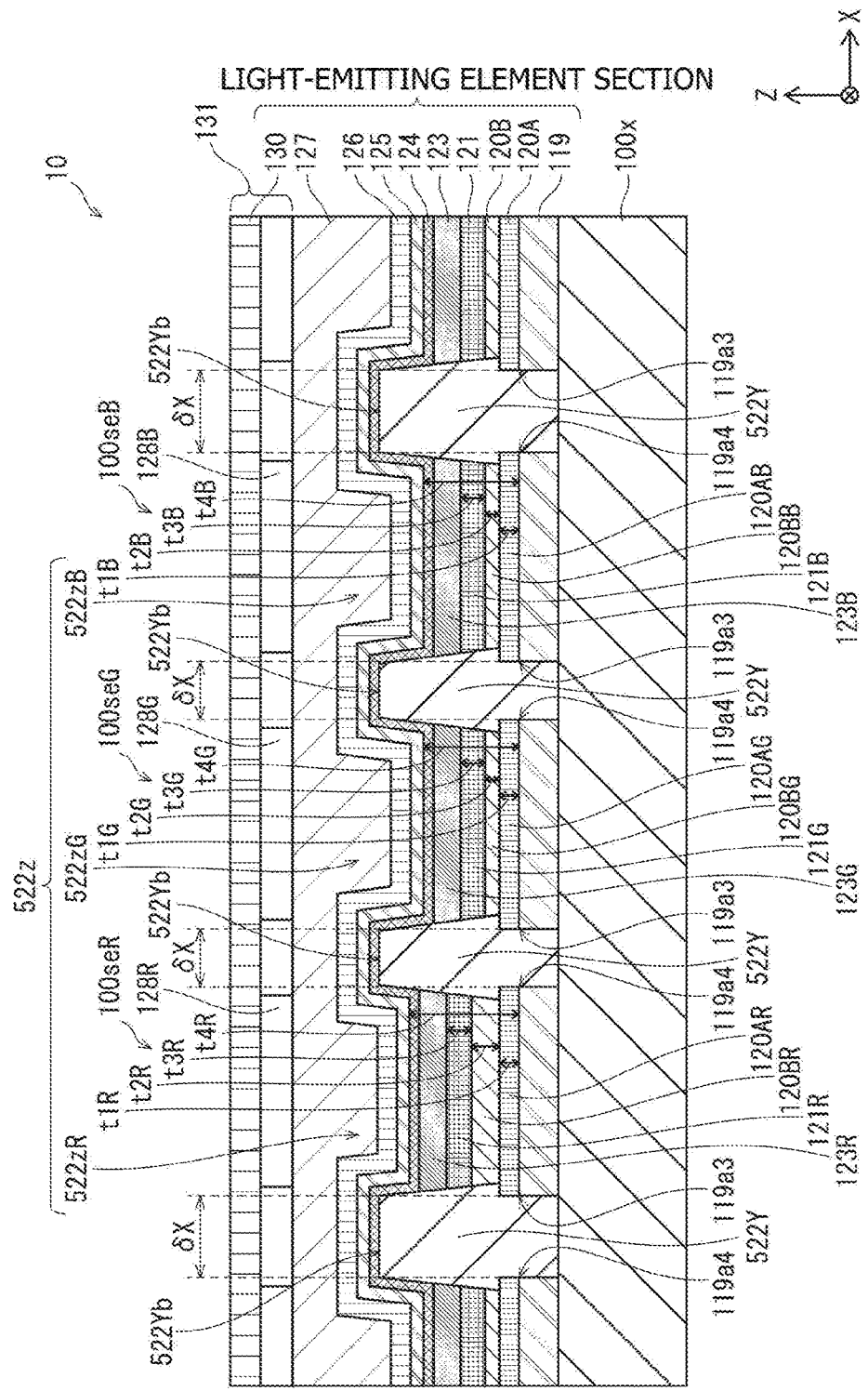
FIG. 5 is a schematic sectional view taken along line B-B of FIG. 3.

FIG. 3 is a schematic plan view showing a part of the display panel 10 according to the present embodiment. FIG. 4 is a schematic sectional view taken along line A-A of FIG. 3. FIG. 5 is a schematic sectional view taken along line B-B of FIG. 3.

The display panel 10 is an organic EL display panel which utilizes an electroluminescence phenomenon of an organic compound, and has a top emission type configuration wherein a plurality of organic EL elements 100 individually constituting pixels are arranged in a matrix pattern on a substrate 100x (TFT substrate) formed with thin film transistors (TFTs) and light is emitted from the upper surface. Herein, an X-direction, a Y-direction and a Z-direction in FIG. 3 are assumed to be a row direction, a column direction and a thickness direction in the display panel 10, respectively.

In a display element arrangement region 10e of the display panel 10, the unit pixels 100e corresponding to the organic EL elements 100 are arranged in a matrix pattern. In each unit pixel 100e, three kinds of self-luminescence regions 100a where light is emitted by an organic compound, namely, a self-luminescence region 100aR for emitting light in red, a self-luminescence region 100aG for emitting light in green, and a self-luminescence region 100aB for emitting light in blue (hereinafter generically referred to as "100a" where 100aR, 100aG and 100aB are not discriminated from one another) are formed. Specifically, three sub-pixels 100se (hereinafter referred to as "red sub-pixel 100seR," "green sub-pixel 100seG" and "blue sub-pixel 100seB" when discriminated from one another) corresponding respectively to the self-luminescence regions 100aR, 100aG and 100aB arranged in the row direction as shown in FIG. 3 are combined into a set, and such a set constitutes the unit pixel 100e in color display.

In addition, as shown in FIG. 3, in the display panel 10, a plurality of pixel electrode layers 119 are arranged on the substrate 100x in a matrix pattern in the state of being spaced away by predetermined distances in the row direction and the column direction. The pixel electrode layers 119 are rectangular in shape in plan view, and are formed from a light-reflecting material. The pixel electrode layers 119 arranged in the matrix pattern correspond to the three self-luminescence regions 100aR, 100aG and 100aB arranged in order in the row direction.

In the display panel 10, the shape of banks 122 is of a so-called line-shaped insulating layer type. Specifically, over row-directionally outer edges 119a3 and 119a4 of two pixel electrode layers 119 adjacent to each other in the row direction and over regions of the substrate 100x located between the outer edges 119a3 and 119a4, a plurality of column banks 522Y each extending in the column direction (in the Y-direction in FIG. 3) are juxtaposed in the row direction. Therefore, the row-directionally outer edges of the self-luminescence regions 100a are defined by the row-directionally outer edges of the column banks 522Y.

On the other hand, over column-directionally outer edges 119a1 and 119a2 of two pixel electrode layers 119 adjacent to each other in the column direction and over regions of the substrate 100x located between the outer edges 119a1 and 119a2, a plurality of row banks 122X each extending in the row direction (the X-direction in FIG. 3) are juxtaposed in the column direction. The region in which the row bank 122X is formed does not show organic electroluminescence in a light-emitting layer 123 over the pixel electrode layer 119, and, therefore, serves as a non-self-luminescence region 100b. Therefore, the column-directionally outer edges of the non-self-luminescence regions 100b are defined by the column-directionally outer edges of the row banks 122X.

Where the areas between the adjacent column banks 522Y are defined as gaps 522z, the gaps 522z include red gaps 522zR corresponding to the self-luminescence regions 100aR, green gaps 522zG corresponding to the self-luminescence regions 100aG, and blue gaps 522zB corresponding to the self-luminescence regions 100aB (hereinafter referred to as "gaps 522z" where the gap 522zR, the gap 522zG and the gap 522zB are not discriminated from one another), and the display panel 10 has a configuration wherein multiplicities of the column banks 522Y and the gaps 522z are alternately arranged.

Besides, as shown in FIG. 3, in the display panel 10, the plurality of self-luminescence regions 100a and the plurality of non-self-luminescence regions 100b are alternately arranged in the column direction along the gap 522z. In the non-self-luminescence region 100b, a connection recess 119c (contact hole) for connection between the pixel electrode layer 119 and the TFT source S1 is present, and a contact region 119b (contact window) on the pixel electrode layer 119 for electrical connection to the pixel electrode layer 119 is provided.

As shown in FIGS. 4 and 5, in one sub-pixel 100se, the column bank 522Y provided in the column direction and the row bank 122X provided in the row direction are orthogonal to each other, and the self-luminescence region 100a is located between the row bank 122X and the row bank 122X in the column direction.

4. Configuration of Each Part of Display Panel 10

A configuration of the organic EL element 100 in the display panel 10 will be described referring to FIGS. 4 and 5.

In the display panel 10 according to the present embodiment, a substrate 100x (TFT substrate) formed with thin film transistors is configured on the lower side in the Z-axis direction, and an organic EL element sections are configured thereon.

4.1 Substrate 100x (TFT Substrate)

The substrate 100x is a support member of the display panel 10. The substrate 100x includes a base material (not shown), a TFT layer (not shown) formed on the base material, and an interlayer insulating layer (not shown) formed on the base material and on the TFT layer.

The base material is a support member for the display panel 10, and is flat plate-like in shape. Materials having electrical insulation property such as a glass material, a resin material, a semiconductor material, a metallic material coated with an insulating layer, and the like can be used as the base material.

The TFT layer includes a plurality of TFTs and wirings formed on the upper side of the base material. The TFT is for electrically connecting the pixel electrode layer 119 corresponding to itself and an external power supply in response to a driving signal supplied from an external circuit for the display panel 10, and is of a multilayer structure which includes electrodes, a semiconductor layer or layers, an insulating layer or layers, and the like. Wirings electrically interconnect the TFTs, the pixel electrode layers 119, the external power supply, the external circuit, and the like.

The interlayer insulating layer located on the upper side of the substrate 100x is for flattening (planarizing) at least the sub-pixels 100se on the upper side of the substrate 100x which has projections and recesses due to the TFT layer. In addition, the interlayer insulating layer fills up the spacings between the wirings and the TFTs, for electrical insulation between the wirings and the TFTs.

4.2 Organic EL Element Section (1) Pixel Electrode Layer 119

On the interlayer insulating layer located on the upper side of the substrate 100x, the pixel electrode layers 119 are provided on a sub-pixel 100se basis. The pixel electrode layer 119 is for supplying carriers to the light-emitting layer 123; for example, where the pixel electrode layer 119 functions as an anode, it supplies holes to the light-emitting layer 123. In addition, since the display panel 10 is of the top emission type, the pixel electrode layers 119 have a light reflecting property and are rectangular flat plate-like in shape. The pixel electrode layers 119 are arranged on the substrate 100x at intervals δX in the row direction and at intervals δY in the column direction in each of the gaps 522z. In addition, the connection recess 119c of the pixel electrode layer 119, which is formed by recessing a part of the pixel electrode layer 119 in the direction of the substrate 100x, and the source S1 of the TFT are connected to each other through the contact hole opened on the upper side of the substrate 100x.

(2) Hole Injection Layer 120

A hole injection layer 120 is stacked on the pixel electrode layer 119. The hole injection layer 120 has a function to transport holes injected from the pixel electrode layer 119 to a hole transport layer 121.

The hole injection layer 120 includes a lower layer 120A made of a metallic oxide formed on the pixel electrode layer 119, and an upper layer 120B made of an organic material stacked at least on the lower layer 120A, in this order from the substrate 100x side. In the present embodiment, a configuration is adopted wherein, in the gaps 522z described later, the upper layer 120B is provided in a line form extending in the column direction. However, a configuration may also be adopted wherein the upper layer 120B is formed only on the lower layer 120A formed on the pixel electrode layer 119, and is provided intermittently in the column direction in the gaps 522z.

The lower layer 120A is configured as a tungsten oxide layer including tungsten oxide (in composition formula WOx, x is a real number in the range of approximately 2<x<3) and having a film thickness of not less than 2 nm (here, 10 nm, for example). The lower layer 120A is desirably composed of tungsten oxide, but may include impurities in trace amounts on the order of usual mixing-in of impurities. The film thickness is preferably not less than 2 nm since when the film thickness is not less than 2 nm, it is easy to form a film uniformly and to form a Schottky ohmic connection between the hole injection layer 120 and an anode 2 described below. The Schottky ohmic connection is formed stably when the film thickness of tungsten oxide is not less than 2 nm. When the hole injection layer 120 is formed in a film thickness of not less than 2 nm, therefore, it can be expected to obtain a stable hole injection efficiency from the pixel electrode layer 119 to the hole injection layer 120 by utilizing the Schottky ohmic connection. The "Schottky ohmic connection" refers to a connection wherein the difference between the Fermi level of the pixel electrode layer 119 and the lowest binding energy of the occupied levels in the vicinity of the Fermi surface of the above-mentioned hole injection layer 120 is within a predetermined value.

The film density of the lower layer 120A is set to be within the range of 5.8 to 6.0 g/cm3. Since the film is formed under specific film forming conditions, an oxygen defect structure with oxygen atoms partially bound to tungsten atoms is present in the film, and, in an electron state, an occupied level is present within a binding energy region which is lower by 1.8 to 3.6 eV than the upper end of the valence band, namely, the lowest binding energy of the valence band. This occupied level is the highest occupied level in the hole injection layer 120, and the binding energy range thereof is the closest to the Fermi level (Fermi surface) of the hole injection layer 120.

Besides, as shown in FIG. 5, where the lower layers 120A provided in the blue sub-pixel 100seB, the green sub-pixel 100seG and the red sub-pixel 100seR are referred to respectively as a lower layer 120AB, a lower layer 120AG and a lower layer 120AR, then the film thicknesses t1B, t1G and t1R of the lower layer 120AB, the lower layer 120AG and the lower layer 120AR are equivalent, and the film thicknesses are preferably 5 to 20 nm.

The upper layer 120B is stacked on a row bank 122X and the lower layer 120A of the hole injection layer 120 in the gap 522z, and the upper layer 120B is in contact with the lower layer 120A. The hole transport layer 121 has a function of transporting the holes injected from the lower layer 120A to the light-emitting layer 123. As the upper layer 120B, there can be used, for example, a coating film formed from an organic polymer solution containing a conductive polymer material such as PEDOT (a mixture of polythiophene and polystyrenesulfonic acid).

In the present embodiment, a configuration is adopted wherein, in the gaps 522z described later, the upper layer 120B is provided in a line form extending in the column direction, like the lower layer 120A. However, a configuration may also be adopted wherein the upper layer 120B is intermittently provided in the column direction in the gaps 522.

In addition, as shown in FIG. 5, where the upper layers 120B provided in the blue sub-pixel 100seB, the green sub-pixel 100seG and the red sub-pixel 100seR are referred to respectively as an upper layer 120BB, an upper layer 120BG and an upper layer 120BR, then the thickness t2R of the upper layer 120BR is greater than the thickness t2B of the upper layer 120BB and the thickness t2G of the upper layer 120BG. It is preferable that the thickness t2B of the upper layer 120BB is more than 0 nm and not more than 25 nm, the thickness t2G of the upper layer 120BG is more than 0 nm and not more than 30 nm, and the thickness t2R of the upper layer 120BR is 20 to 50 nm.

(3) Bank 122

A bank 122 made of an insulating material is formed in such a manner as to cover end edges of the pixel electrode layers 119, the hole injection layers 120 and the hole transport layers 121. The bank 122 includes a plurality of column banks 522Y extending in the column direction and juxtaposed in the row direction, and a plurality of row banks 122X extending in the row direction and juxtaposed in the column direction. As shown in FIG. 3, the column banks 522Y are provided along the column direction orthogonal to the row banks 122X, the column banks 522Y and the row banks 122X forming a grid pattern (hereinafter referred to as "banks 122" when the row banks 122X and the column banks 522Y are not discriminated from each other).

The row bank 122X is in a line form extending in the row direction, and its section cut in parallel to the column direction is a normally tapered trapezoid shape tapered on the upper side. The row bank 122X is provided in the state of extending along the row direction orthogonal to the column direction such as to penetrate the column banks 522Y, and has an upper surface 122Xb at a position lower than an upper surface 522Yb of the column bank 522Y. Therefore, the row banks 122X and the column banks 522Y define openings corresponding to the self-luminescence regions 100a.

The row banks 122X are for controlling the flow in the column direction of an ink containing an organic compound as a material for the light-emitting layer 123. Therefore, the row banks 122X should have affinity for the ink at a level of not less than a predetermined value. By this configuration, the flow property in the column direction of the ink containing an organic compound as the material for the light-emitting layer 123 is enhanced, and variations in the ink application amount among the sub-pixels 100se are restrained. The row banks 122X prevent the pixel electrode layers 119 from being exposed, and, in the regions where the row banks 122X are present, light emission does not occur, so that these regions do not contribute to luminance.

Specifically, the row banks 122X are present over the column-directionally outer edges 119a1 and 119a2 of the pixel electrode layers 119, and are formed in the state of overlapping with parts 119b of the pixel electrode layers 119. The column-directional length of the non-self-luminescence regions 100b where the row banks 122X are formed is set to be greater by a predetermined length than the distance δY between the column-directionally outer edges 119a1 and 119a2 of the pixel electrode layer 119. By this configuration, the row banks 122X cover the column-directionally outer edges 119a1 and 119a2 of the pixel electrode layers 119, thereby preventing electrical leakage between the pixel electrode layers 119 and a counter electrode layer 125, and define outer edges of the self-luminescence regions 100a of the sub-pixels 100se in the column direction.

The column banks 522Y define row-directionally outer edges of the light-emitting layers 123 formed by damming up the flow in the column direction of the ink containing an organic compound as the material for the light-emitting layers 123. The column bank 522Y is in a line form extending in the column direction, and its section cut in parallel to the row direction is a trapezoid reduced in width on the upper side.

The column banks 522Y are present over the row-directionally outer edges 119a3 and 119a4 of the pixel electrode layers 119, and are formed in the state of overlapping with parts of the pixel electrode layers 119. The row-directional width of the regions where the column banks 522Y are formed is set to be greater by a predetermined width than the distance δX between the row-directionally outer edges 119a3 and 119a4 of the pixel electrode layer 119. By this configuration, the column banks 522Y cover the row-directionally outer edges 119a3 and 119a4 of the pixel electrode layers 119, thereby preventing electrical leakage between the pixel electrode layers 119 and the counter electrode layer 125, and define outer edges of the self-luminescence regions 100a of the sub-pixels 100se in the row direction. As has been mentioned above, the column banks 522Y define the outer edges of self-luminescence regions of the pixels in the row direction. Therefore, the column banks 522Y should have repellency to the ink at a level of not less than a predetermined value.

(4) Hole Transport Layer 121

The hole transport layer 121 is stacked on the row bank 122X and the hole injection layer 120 in the gap 522z, and the hole transport layer 121 is in contact with the upper layer 120B of the hole injection layer 120. The hole transport layer 121 has a function of transporting the holes injected from the hole injection layer 120 to the light-emitting layer 123. The hole transport layer 121 is made, for example, of a high-molecular compound such as a polyfluorene or a derivative thereof or a polyallylamine, which is an amine organic polymer, or a derivative thereof.

In the present embodiment, a configuration is adopted wherein, in the gaps 522z described later, the hole transport layer 121 is provided in a line form extending in the column direction, like the upper layer 120B. However, a configuration may also be adopted wherein the hole transport layer 121 is intermittently provided in the column direction in the gaps 522z.

In addition, as shown in FIG. 5, where the hole transport layers 121 provided in the blue sub-pixel 100seB, the green sub-pixel 100seG and the red sub-pixel 100seR are referred to respectively as a hole transport layer 121B, a hole transport layer 121G and a hole transport layer 121R, then the film thicknesses t3B, t3G and t3R of these hole transport layers are equivalent, and the film thicknesses t3B, t3G and t3R are preferably 5 to 20 nm.

(5) Light-Emitting Layer 123

The light-emitting layer 123 is a layer made of an organic compound, and has a function of emitting light through recombination of holes and electrons in the inside thereof. In the gaps 522z, the light-emitting layers 123 are provided in a line form such as to extend in the column direction. The display panel 10 has a configuration wherein multiplicities of column banks 522Y and gaps 522z are alternately arranged. In the gaps 522z defined by the column banks 522Y, the light-emitting layers 123 are formed to extend in the column direction. In the red gap 522zR corresponding to the self-luminescence region 100aR in the red sub-pixel 100seR, the green gap 522zG corresponding to the self-luminescence region 100aG in the green sub-pixel 100seG, and the blue gap 522zB corresponding to the self-luminescence region 100aB in the blue sub-pixel 100seB, there are formed the light-emitting layers 123 which emit light in the respective colors. Where the light-emitting layers 123 provided in the blue gap 522zB, the green gap 522zG and the red gap 522zR are referred to respectively as the light-emitting layer 123B, the light-emitting layer 123G and the light-emitting layer 123R, then the film thicknesses of these light-emitting layers 123B, 123G and 123R are equivalent.

The light-emitting layers 123 emit light only at the parts where the carriers are supplied from the pixel electrode layers 119. In the ranges in which the row bank 122X made of an insulating material is present between the layers, therefore, the electroluminescence phenomenon of an organic compound does not occur. Accordingly, the light-emitting layers 123 emit light only at the parts where the row bank 122X is absent, and these parts serve as the self-luminescence regions 100a; besides, the column-directionally outer edges of the self-luminescence regions 100a are defined by the column-directionally outer edges of the row banks 122X.

Of the light-emitting layers 123, the parts 119b located over side surfaces and upper surfaces 122Xb of the row banks 122X do not emit light, and these parts serve as the non-self-luminescence regions 100b. The light-emitting layers 123 are located on the upper side of the hole transport layers 121 in the self-luminescence regions 100a, and are located on the upper side of the hole transport layers 121 on the upper surface 122Xb and side surfaces of the row banks 122X in the non-self-luminescence regions 100b.

Note that as shown in FIG. 4, the light-emitting layers 123 extend continuously, not only in the self-luminescence regions 100a but also in the non-self-luminescence regions 100b adjacent to the self-luminescence regions 100a. Such a configuration ensures that when forming the light-emitting layer 123, the ink applied to the self-luminescence regions 100a can flow in the column direction through the ink applied to the non-self-luminescence regions 100b, so that the film thickness can be leveled among the pixels in the column direction. It is to be noted, however, that in the non-self-luminescence regions 100b, the flow of the ink is moderately restrained by the row banks 122X. Therefore, considerable unevenness in film thickness is not liable to occur in the column direction, and unevenness in luminance among pixels is improved.

(6) Electron Transport Layer 124

In the gaps 522z defined by the column banks 522Y inclusive of the areas on the row banks 122X, electron transport layers 124 are formed over the light-emitting layers 123. Besides, in this example, the electron transport layers 124 are arranged also on the upper surfaces 522Yb of the column banks 522Y exposed from the light-emitting layers 123. The electron transport layer 124 has a function of transporting the electrons injected from the counter electrode layer 125 to the light-emitting layer 123.

(7) Counter Electrode Layer 125

The counter electrode layer 125 is stackedly formed in such a manner as to cover the electron transport layers 124. The counter electrode layer 125 is formed in the state of being continuous over the whole part of the display panel 10. The counter electrode layer 125 sandwiches the light-emitting layer 123 between itself and the pixel electrode layer 119 to form a current passing path, thereby supplying the carriers to the light-emitting layer 123; for example, where the counter electrode layer 125 functions as a cathode, it supplies electrons to the light-emitting layer 123. The counter electrode layer 125 is formed along the surfaces of the electron transport layers 124, to serve as a common electrode for the light-emitting layers 123.

Since the display panel 10 is of the top emission type, a conductive material having a light-transmitting property is used for the counter electrode layer 125.

(8) Sealing Layer 126

A sealing layer 126 is stackedly formed in such a manner as to cover the counter electrode layer 125. The sealing layer 126 is for inhibiting the light-emitting layer 123 from being deteriorated due to contact with moisture or air or the like. The sealing layer 126 is provided over the whole area of the display panel 10 in such a manner as to cover the upper surface of the counter electrode layer 125.

(9) Bonding Layer 127

On the upper side in the Z-axis direction of the sealing layer 126, there is disposed a CF substrate 131 having a color filter layer 128 on a main surface on the lower side in the Z-axis direction of an upper substrate 130. The CF substrate 131 is bonded to the sealing layer 126 by a bonding layer 127. The bonding layer 127 has a function of laminating a back panel, which is made of the layers ranging from the substrate 100x to the sealing layer 126, and the CF substrate 131 to each other, and preventing the layers from being exposed to moisture or air.

(10) Upper Substrate 130

The CF substrate 131 having the color filter layer 128 formed on the upper substrate 130 is placed on and bonded to the bonding layer 127. Since the display panel 10 is of the top emission type, a light-transmitting material such as a cover glass and a transparent resin film is used for the upper substrate 130. In addition, by the upper substrate 130, it is possible to enhance the rigidity of the display panel 10 and to prevent penetration of moisture or air or the like into the display panel 10.

(11) Color Filter Layer 128

The upper substrate 130 is formed with the color filter layers 128 at positions corresponding to the self-luminescence regions 100a of the pixels for the respective colors. The color filter layers 128 are transparent layers provided for permitting visible lights of wavelengths corresponding to R, G and B to be transmitted therethrough, and have a function of permitting transmission therethrough of lights emitted from the pixels for the respective colors and correcting the chromaticity of the lights. For instance, in this example, red, green and blue filter layers 128R, 128G and 128B are formed respectively over the self-luminescence regions 100aR in the red gaps 522zR, the self-luminescence regions 100aG in the green gaps 522zG, and the self-luminescence regions 100aB in the blue gaps 522zB. Specifically, the color filter layers 128 are formed by a process in which inks each containing a color filter material and a solvent are applied to the upper substrate 130 composed of a color filter forming cover glass in which a plurality of openings are formed in a matrix pattern on a pixel basis.

4.3 Constituent Material for Each Part

An example of the constituent material for each of the parts shown in FIGS. 4 and 5 will be shown below.

(1) Substrate 100x (TFT Substrate)

As a lower substrate, there can be adopted, for example, a glass substrate, a quartz substrate, a silicon substrate, a molybdenum sulfide substrate, a metallic substrate such as substrates of copper, zinc, aluminum, stainless steel, magnesium, iron, nickel, gold and silver, a semiconductor substrate such as gallium arsenic substrate, plastic substrates, and the like. In addition, as flexible plastic material, there can be used either of thermoplastic resins and thermosetting resins. As the material, there can be used electrically insulating materials, for example, resin materials. Specific examples of the resins include polyethylene, polypropylene, ethylene-propylene copolymers, cyclic polyolefins, modified polyolefins, polystyrene, polyimides (PI), polyamide imides, polycarbonates, poly-(4-methylpentene-1), ionomers, acrylic resins, polymethyl methacrylate, acryl-styrene copolymers (AS resins), butadiene-styrene copolymers, ethylene vinyl alcohol copolymer (EVOH), polyethylene terephthalate (PET), polybutylene terephthalate, polyethylene naphthalate (PEN), polycyclohexane terephthalate (PCT) and the like polyester, polyethers, polyether-ketones, polyether sulfones (PES), polyether imides, polyacetal, polyphenylene oxide, modified polyphenylene oxide, polyarylate, aromatic polyesters (liquid crystal polymers), epoxy resins, phenolic resins, urea resins, melamine resins, unsaturated polyesters, silicone resins, polyurethane, etc. and copolymers, blends, polymer alloys containing these resins as main constituent, which may be used either singly or as laminate of two or more of them. For a gate electrode, a gate insulating layer, a channel layer, a channel protecting layer, a source electrode, a drain electrode and the like constituting the TFTs, there can be used known materials. As the gate electrode, for example, a laminate of copper (Cu) and molybdenum (Mo) is adopted. For the gate insulating layer, known organic materials and inorganic materials can both be used so long as they are electrically insulating materials, such as silicon oxide (SiO2) and silicon nitride (SiNx). For the channel layer, there can be used oxide semiconductors containing at least one selected from indium (In), gallium (Ga) and zinc (Zn). For the channel protecting layer, there can be used, for example, silicon oxynitride (SiON), silicon nitride (SiN), or aluminum oxide (AlOx). As the source electrode and the drain electrode, there can adopted, for example, laminates of copper-manganese (CuMn) and copper (Cu) and molybdenum (Mo).

For the insulating layer at an upper part of the TFTs, there can also be used, for example, silicon oxide (SiO2), silicon nitride (SiN), silicon oxynitride (SiON), and silicon oxide (SiO). As a connection electrode layer of the TFTs, there can be adopted, for example, laminates of molybdenum (Mo), copper (Cu) and copper-manganese (CuMn). Note that the material to be used to constitute the connection electrode layer is not limited to the just-mentioned, and can be appropriately selected from conductive materials.

An interlayer insulating layer located on the upper side of the substrate 100x is formed by use of an organic compound such as polyimide resins, acrylic resins, siloxane resins, and novolak type phenolic resins, and its thickness may be, for example, in the range of 2.0 to 8.0 μm.

(2) Pixel Electrode Layer 119

The pixel electrode layer 119 is formed of a metallic material. In the case of the display panel 10 according to the present embodiment which is of the top emission type, the chromaticity of the lights to be emitted is controlled and the luminance is enhanced by setting an appropriate thickness and adopting an optical resonator structure, and, therefore, a surface part of the pixel electrode layer 119 should have a highly reflective property. In the display panel 10 according to the present embodiment, the pixel electrode layer 119 may have a structure wherein a plurality of films selected from metallic films, alloy films and transparent conductive films are laminated. The metallic layer can be formed, for example, from a metallic material containing silver (Ag) or aluminum (Al). For the alloy layer, there can be used, for example, APC (an alloy of silver, palladium and copper), ARA (an alloy of silver, rubidium and gold), MoCr (an alloy of molybdenum and chromium), NiCr (an alloy of nickel and chromium), and the like. As the constituent material for the transparent conductive layer, there can be used, for example, indium tin oxide (ITO), indium zinc oxide (IZO) and the like.

(3) Hole Injection Layer 120

The lower layer 120A of the hole injection layer 120 is a layer formed of an oxide of, for example, silver (Ag), molybdenum (Mo), chromium (Cr), vanadium (V), tungsten (W), nickel (Ni), iridium (Ir) or the like. In the case where the lower layer 120A is composed of an oxide of a transition metal, it can take a plurality of levels by taking a plurality of oxidation numbers, and, as a result, hole injection is facilitated and the driving voltage can be reduced. In the present embodiment, the lower layer 120A is configured to contain an oxide of tungsten (W). In this case, the driving voltage of the organic EL element is lower as the ratio (W5+/W6+) of pentavalent tungsten atoms to hexavalent tungsten atoms in the oxide of tungsten (W) is greater; therefore, it is preferable that the content of the pentavalent tungsten atoms is not less than a predetermined value.

As the upper layer 1206 of the hole injection layer 120, there can be used a coating film formed from an organic polymer solution of a conductive polymer material of, for example, PEDOT, as above-described.

(4) Bank 122

The bank 122 is formed by use of an organic material such as resin, and has an insulating property. Examples of the organic material to be used for forming the bank 122 include acrylic resins, polyimide resins, and novolak type phenolic resins. It is preferable that the bank 122 is resistant to organic solvents. More preferably, it is desirable to use an acrylic resin for the bank 122 since acrylic resins are low in refractive index and preferable for use as reflector.

Alternatively, in the case of using an inorganic material for the bank 122, it is preferable to use, for example, silicon oxide (SiO), from the viewpoint of refractive index. Alternatively, the bank 122 may be formed by use of such an inorganic material as, for example, silicon nitride (SiN) or silicon oxynitride (SiON).

Furthermore, since the bank 122 may be subjected to an etching treatment, a baking treatment or the like in the manufacturing process, it is preferable that the bank 122 is formed of a highly resistant material such as not to be deformed or denatured excessively when subjected to such treatments.

In addition, the surface of the bank 122 may be subjected to a fluorine treatment for rendering the surface water-repellent. Besides, a fluorine-containing material may be used to form the bank 122. Further, for lowering the water repellency of the surface of the bank 122, the bank 122 may be irradiated with ultraviolet (UV) rays or baked at a low temperature.

(5) Hole Transport Layer 121

For the hole transport layer 121, there can be used, for example, high-molecular compounds such as polyfluorene and derivatives thereof, polyallylamines (which are amine organic polymers) and derivatives thereof, TFB (poly(9,9-di-n-octylfluorene-alt-(1,4-phenylene-((4-sec-butylphenyl)imino)-1,4-phenylene)), and the like.

(6) Light-Emitting Layer 123

As has been described above, the light-emitting layer 123 has a function of emitting light by generation of an excited state through recombination of the holes and electrons injected thereinto. As the material for forming the light-emitting layer 123, a light-emitting organic material which can be formed into a film by use of a wet printing method should be used.

Specifically, the light-emitting layer 123 is preferably formed from a fluorescent material such as oxinoid compounds, perylene compounds, coumarin compounds, azacoumarin compounds, oxazole compounds, oxadiazole compounds, perynone compounds, pyrrolopyrrole compounds, naphthalene compounds, anthracene compounds, fluorene compounds, fluoranthene compounds, tetracene compounds, pyrene compounds, coronene compounds, quinolone compounds and azaquinolone compounds, pyrazoline derivatives and pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylenepyran compounds, dicyanomethylenethiopyran compounds, fluorescein compounds, pyrylium compounds, thiapyrylium compounds, selenapyrylium compounds, telluropyrylium compounds, aromatic aldadiene compounds, oligophenylene compounds, thioxanthene compounds, cyanine compounds, acridine compounds, metal complexes of 8-hydroxyquinoline compounds, metal complexes of 2-bipyridine compounds, complexes of Schiff base and Group III metal, oxine metal complexes, and rare earth complexes, which are described in patent publication (Japanese Patent Laid-open No. 1993-163488).

(7) Electron Transport Layer 124

The electron transport layer 124 is formed by use of any of, for example, oxadiazole derivatives (OXD), triazole derivatives (TAZ), phenanthroline derivatives (BCP, Bphen), and the like.

(8) Counter Electrode Layer 125

For the counter electrode layer 125, a conductive material having a light-transmitting property is used. For example, indium tin oxide (ITO), indium zinc oxide (IZO) or the like is used to form the counter electrode layer 125. In addition, an electrode obtained by forming a thin film of silver (Ag), aluminum (Al) or the like may be used.

(9) Sealing Layer 126

The sealing layer 126 has a function of inhibiting the organic layers such as the light-emitting layers 123 from being exposed to moisture or being exposed to air, and is formed by use of a light-transmitting material such as silicon nitride (SiN) or silicon oxynitride (SiON), for example. In addition, a sealing resin layer formed of a resin such as acrylic resins and silicone resins may be provided on a layer formed by use of silicon nitride (SiN), silicon oxynitride (SiON) or the like.

In the case of the display panel 10 according to the present embodiment which is of the top emission type, the sealing layer 126 should be formed from a light-transmitting material.

(10) Bonding Layer 127

The material for the bonding layer 127 is, for example, a resin adhesive or the like. For the bonding layer 127, there can be adopted light-transmitting resin material such as acrylic resins, silicone resins and epoxy resins.

(11) Upper Substrate 130

As the upper substrate 130, there can be used, for example, substrates of a light-transmitting material such as glass substrates, quartz substrates, and plastic substrates.

(12) Color Filter Layer 128

For the color filter layers 128, there can be adopted known resin materials (for example, such commercially available materials as Color Resists produced by JSR Corporation).

5. Method of Manufacturing Display Panel 10

(1) Formation of Pixel Electrode Layer 119

Figure 6A:
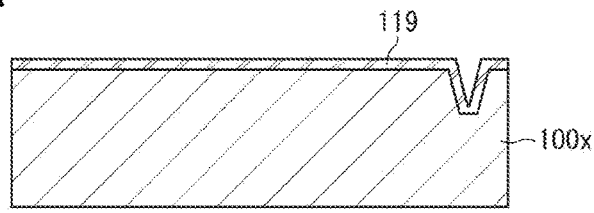
FIGS. 6A to 6E are schematic sectional views taken along the same position as line A-A of FIG. 3, depicting the states in steps of manufacture of the organic EL display panel.

As shown in FIG. 6A, a TFT substrate 100x wherein layers ranging to the interlayer insulating layer have been formed is prepared. Contact holes are opened in the interlayer insulating layer, and pixel electrode layers 119 are formed.

The formation of the pixel electrode layers 119 is carried out by forming a metallic film by sputtering or vacuum deposition, followed by patterning by photolithography and etching. Note that the pixel electrode layers 119 are in the state of electrical contact with electrodes of the TFTs.

(2) Formation of Lower Layer 120A of Hole Injection Layer 120

Figure 6B:
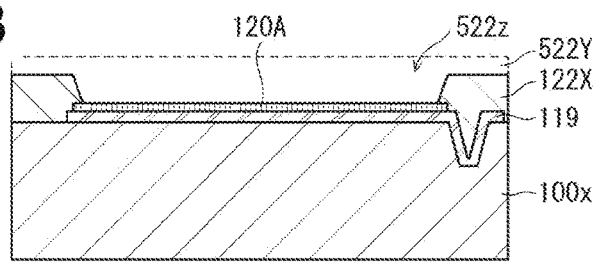

As depicted in FIG. 6B, lower layers 120A of hole injection layers 120 are formed on the pixel electrode layers 119, and banks 122 are formed in such a manner as to cover edge portions of the lower layers 120A.

The lower layers 120A are formed by forming films of a metal (for example, tungsten) by sputtering or vapor phase growth such as vacuum deposition, and thereafter performing baking to cause oxidation of the metallic layer, followed by patterning on a pixel basis by photolithography and etching. By film formation and baking under predetermined conditions, the lower layers 120A made of tungsten oxide films containing tungsten oxide having an oxygen defect structure are formed, to form the above-mentioned occupied levels.

Here, reactive sputtering is preferably used to form the films. Generation of unevenness in film formation is restrained. Specifically, reactive sputtering is conducted with metallic tungsten as a target. Argon gas as a sputter gas and oxygen gas as a reactive gas are introduced into a chamber. In this state, argon is ionized by a high voltage, and argon ions are made to collide against the target. In this case, metallic tungsten released by the sputtering phenomenon is reacted with oxygen gas to become tungsten oxide, and a tungsten oxide film is formed on the pixel electrode layers 119.

Note that the film forming conditions in this instance are set to so-called low-rate conditions. The film forming rate can be controlled by both the density of power inputted to the film forming apparatus and the gas flow rate (partial pressure) ratio. In the formation of a film of tungsten oxide, an increase in the flow rate (partial pressure) of oxygen in the gas lowers the film forming rate. With the film formation conducted at a low rate, a porous film quality close to that of an evaporated film is obtained. Then, at least in a surface layer of tungsten oxide, the oxygen defect structure wherein oxygen atoms are partially bound to tungsten atoms can be formed, and favorable presence of occupied levels within a binding energy region of lower by 1.8 to 3.6 eV than the lowest binding energy in the valence band can be realized. By this, favorable hole injection characteristics can be secured.

Furthermore, the tungsten oxide film thus formed may be subjected to a baking step. By this, film density is enhanced, and dissolution resistance is imparted to the film. Specifically, the lower layer 120A is baked and tightened by a baking step under predetermined conditions (an atmospheric baking step performed at a heating temperature of 200° C. to 230° C. for a heating time of 15 to 45 minutes) after the formation of the tungsten film. Too high a heating temperature causes a problem in that in the case where an interlayer insulating film (flattening or planarizing film) or the like is provided on the surface of the substrate 100x, the interlayer insulating film or the like may be denatured; therefore, care should be taken. By this treatment, the film density is increased to within the range of 5.8 to 6.0 g/cm3. With the film density thus increased, the dissolution resistance with respect to the etching liquid or cleaning liquid used in the bank formation step at the time of manufacturing is imparted to the film, whereby depletion of the film through dissolution is restrained. When the baking is based on the above-mentioned baking conditions, the oxygen defect structure in the film is maintained even upon the baking step, and, therefore, the occupied levels are retained, and hole injection characteristics are prevented from being lowered. In this way, favorable hole injection characteristics and dissolution resistance are both realized in a high extent.

(3) Formation of Bank 122

As shown in FIG. 6B, the banks 122 are formed in such a manner as to cover edge portions of the lower layers 120A. In the formation of the banks 122, the row banks 122X are first formed, and thereafter the column banks 522Y are formed to form the gaps 522Z defining the pixels, such that the surface of the lower layer 120A of the hole injection layer 120 is exposed between the row bank 122X and the row bank 122X in the gap 522Z.

In forming the banks 122, first, a film of a constituent material (for example, a photosensitive resin material) for the banks 122 is stackedly formed on the lower layers 120A by spin coating or the like. Then, the resin film is patterned to sequentially form the row banks 122X and the column banks 522Y. The patterning of the row banks 122X and the column banks 522Y is carried out by performing exposure using photomasks over the resin film, and then performing a developing step and a baking step (at approximately 230° C. for approximately 60 minutes).

Specifically, in the step of forming the row banks 122X, first, a photosensitive resin film of an organic photosensitive resin material such as, for example, acrylic resin, polyimide resin or novolak type phenolic resin is formed, and then drying is conducted to volatilize the solvent to a certain extent, after which a photomask provided with predetermined openings is laid thereover, and irradiation with UV rays from above the photomask is conducted to expose the photoresist made of the photosensitive resin or the like, thereby transferring the pattern possessed by the photomask to the photoresist. Next, the photosensitive resin is developed to form an insulating layer in which the row banks 122X are patterned. In general, a photoresist of the so-called positive type is used. Of the positive type photoresist, those parts which are exposed to light are removed by development. Those parts which are not exposed and which correspond to the mask pattern are not removed by development but remain as the row banks 122X in a thickness of approximately 500 nm.

In forming the column banks 522Y, first, a film of a constituent material (for example, a photosensitive resin material) for the column banks 522Y is stackedly formed by spin coating or the like. Then, the resin film is patterned to open the gaps 522z, thereby forming the column banks 522Y. The formation of the gaps 522z is carried out by performing exposure through a mask set over the resin film, followed by development. The column banks 522Y extend in the column direction and are juxtaposed through the gaps 522z in the row direction.

In addition, since the column banks 522Y are for damming up the flow in the column direction of the inks containing an organic compound as a material for the light-emitting layers 123 to thereby define the row-directionally outer edges of the light-emitting layers 123 to be formed, the column banks 522Y should have an ink repellency of not less than a predetermined value. On the other hand, since the row banks 122X are for controlling the flow in the column direction of the inks as a material for the light-emitting layers 123, the row banks 122X should have an affinity for the inks of not less than a predetermined value.

Besides, for imparting water repellency to the surfaces of the column banks 522Y, the surfaces of the column banks 522Y may be subjected to a carbon tetrafluoride (CF4) plasma treatment. In addition, a fluorine-containing material or a composition in which a fluorine-containing material is mixed may be used for forming the column banks 522Y.

On a manufacture basis, an upper limit for film thickness of the row banks 122X is not more than 1,000 nm, whereby variability of film thickness upon manufacture is reduced, and control of bottom line width is made possible. In addition, as the film thickness is reduced, the bottom line width should be set to be comparable to the film thickness. Accordingly, a lower limit for film thickness is not less than 200 nm, whereby it is made possible to obtain a desired bottom line width based on limitation as to resolution. From the viewpoint of manufacturing process, therefore, the thickness of the row banks 122X is preferably, for example, 200 to 1,000 nm. In the present embodiment, the thickness was approximately 500 nm.

On a manufacture basis, an upper limit for film thickness of the column banks 522Y is desirably not more than 1,500 nm, from the viewpoint of enhancement of productivity by a reduction in cost. Besides, as the film thickness is reduced, the bottom line width should be set to be comparable to the film thickness. Accordingly, a lower limit for film thickness is not less than 1 µm, whereby it is made possible to obtain a desired bottom line width based on limitation as to resolution. In addition, in the case of a process involving application of a solution, the ruggedness of the substrate enhances uniformity of film thickness. In view of this, steps of the TFTs should be reduced as much as possible, and this necessity determines the lower limit for film thickness; accordingly, the lower limit for film thickness is preferably not less than 500 nm. Consequently, from the viewpoint of manufacturing process, the thickness of the column banks 522Y is preferably, for example, 500 to 1,500 nm. In the present embodiment, the thickness of the column banks 522Y was approximately 1,000 nm.

(4) Formation of Upper Layer 120B of Hole Injection Layer 120

Figure 6C:
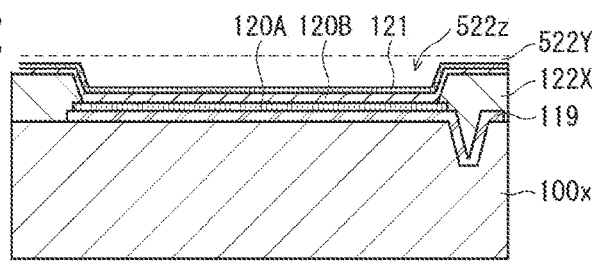

Upper layers 120B of the hole injection layers 120 are formed on the lower layers 120A of the hole injection layers 120 formed in the gaps 522z defined by the column banks 522Y inclusive of the areas over the row banks 122X (FIG. 6C). The upper layers 120B are formed by applying inks containing a conductive polymer material such as PEDOT to the inside of the gaps 522z defined by the column banks 522Y by an ink jet method, followed by volatilizing off the solvent. Alternatively, the upper layers 120B are formed by baking. Thereafter, the upper layers 120B may be patterned on a pixel basis by photolithography and etching.

<Ink Applying Method>

Figure 7A:
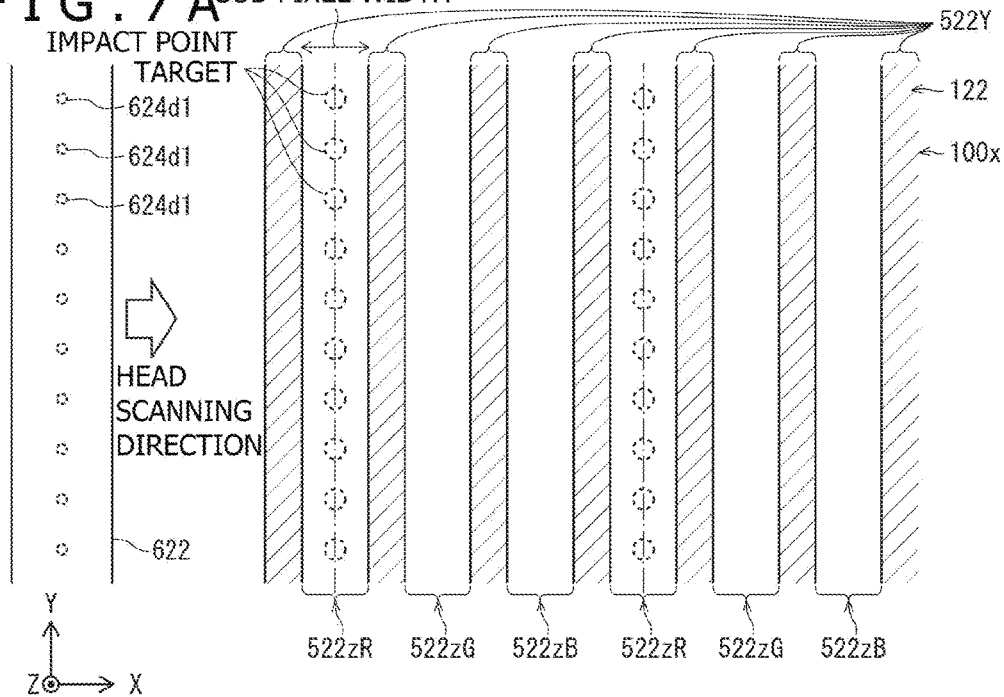
FIGS. 7A and 7B illustrate steps of applying an ink for forming a light-emitting layer to a substrate in a method of manufacturing the organic EL display panel, wherein FIG. 7A corresponds to the case of applying the ink to grid pattern regions defined by row banks and column banks, and FIG. 7B corresponds to the case of applying the ink uniformly to gaps between the column banks.
Figure 7B:
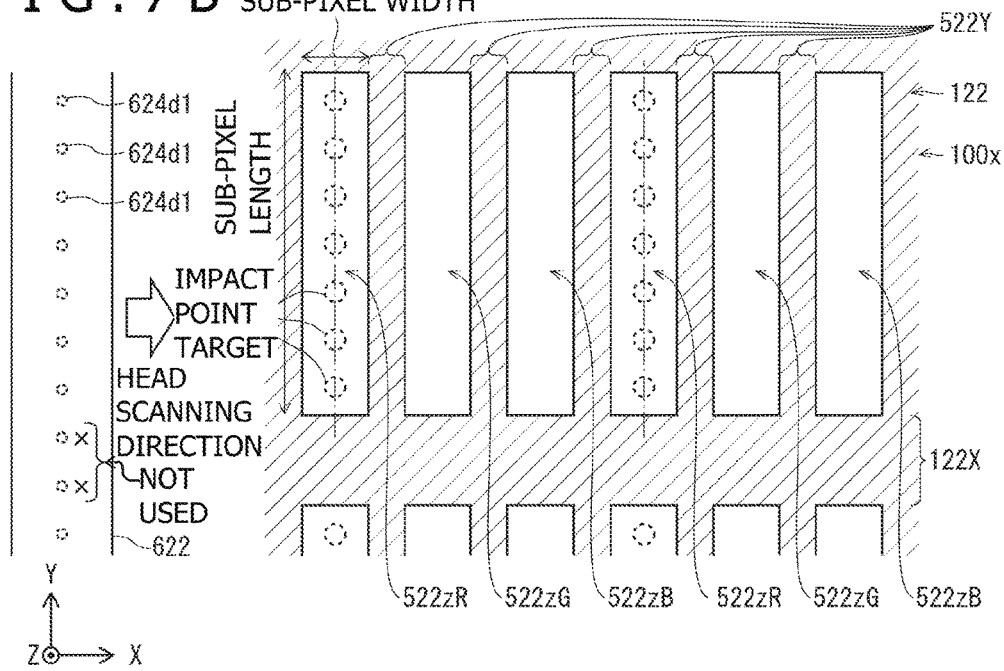

Now, a method of performing the step of forming the upper layers 120B on a mass production basis by an ink jet method will be described below. FIGS. 7A and 7B illustrate a step of applying an ink for forming a light-emitting layer to a substrate, wherein FIG. 7A illustrates a case of uniformly applying the ink to the gaps 522z between the column banks 522Y, and FIG. 7B illustrates a case of applying the ink to those regions in the gaps 522z exclusive of the regions over the row banks 122X.

At the time of forming the upper layers 120B, by using inks which are solutions for forming the upper layers 120B, upper layers are formed in regions between a plurality of line banks; specifically, the upper layers 120BR are formed in the gaps 522zR for the red sub-pixels 100seR, the upper layers 120BG are formed in the gaps 522zG for the green sub-pixels 100seG, and the upper layers 120BB are formed in the gaps 522zB for the blue sub-pixels 100seB. The upper layers 120BR are different in thickness from the upper layers 120BG or the upper layers 120BB. Specifically, the amount of the ink applied to the inside of the gaps 522zR is set larger than the amounts of the inks applied to the inside of the gaps 522zB and the gaps 522zG, whereby the thickness of the upper layers 120BR can be set larger than the thicknesses of the upper layers 120BB and the upper layers 120BG.

For easier explanation, here, the inks are sequentially applied to the inside of the gaps for all of three colors as follows. First, an ink is applied to a plurality of gaps for a first color on the substrate by setting the amount of the ink jetted from nozzles in a first condition. Next, an ink is applied to a plurality of gaps for a second color on the substrate by setting the amount of the ink jetted from the nozzles in a second condition. Subsequently, an ink is applied to a plurality of gaps for a third color by setting the amount of the ink jetted from the nozzles in a third condition. The steps of applying the ink to the gaps for the first color on the substrate 100x, then applying the ink to the gaps for the second color on the substrate and further applying the ink to the gaps for the third color on the substrate are conducted repeatedly, whereby the inks are sequentially applied to the gaps for the three colors.

In the above-mentioned process, the steps of applying the ink to the gaps for the first color on a plurality of substrates, then applying the ink to the gaps for the second color on the plurality of substrates and further applying the ink to the gaps for the third color on the plurality of substrates may be conducted repeatedly, whereby the inks may be sequentially applied to the gaps for the three colors.

On the other hand, such steps as applying the ink to the gap for the first color on a single substrate by setting the amount of the ink jetted from the nozzles in a first condition, then applying the ink to the adjacent gap for the second color by changing the ink amount to a second condition, further applying the ink to the adjacent gap for the third color by changing the ink amount to a third condition, and applying the ink to the adjacent gap for the first color by returning the ink amount to the first condition may be conducted repeatedly, whereby the inks may be continuously applied to all the gaps for the three colors on the single substrate.

[Case of Uniformly Applying Ink to Gaps 522z Between Column Banks 522Y]

Now, a method of applying an ink (for example, an ink for red gaps 522zR) to gaps for one color will be described below.

The upper layers 120B extend continuously, not only in the self-luminescence regions 100a but also over to the adjacent non-self-luminescence regions 100b. According to this, at the time of forming the upper layers 120B, the ink applied to the self-luminescence regions 100a can flow in the column direction through the ink applied to the non-self-luminescence regions 100b, whereby the film thickness can be leveled among the pixels in the column direction. It is to be noted, however, that in the non-self-luminescence regions 100b, the flow of the ink is moderately restrained by the row banks 122X. Therefore, considerable unevenness in film thickness is not liable to occur in the column direction, and unevenness of luminance among pixels and a lowering in service life are improved.

In this ink applying method, as illustrated in FIG. 7A, the substrate 100x is placed on a working table of a liquid droplet jetting apparatus with the column banks 522Y set along the Y-direction, and, while an ink jet head 622 wherein a plurality of jet ports 624d1 are arranged in a line along the Y-direction is scanningly moved in the X-direction, the ink is jetted from the jet ports 624d1 aiming at impact point targets set in the gap 522z between the column banks 522Y.

Note that the region in which the ink as a material for the upper layers 120B is applied in the same applying amount is one of the three regions which are juxtaposed in the X-direction.

[Case of Applying Ink to Regions in Gaps 522z Exclusive of Regions Over Row Banks 122X]

A configuration may be adopted wherein the inks are applied only to grid-formed regions defined by the row banks 122X and the column banks 522Y.

In this ink applying method, as shown in FIG. 7B, the substrate 100x is placed such that the longitudinal direction of each sub-pixel 100se is set along the Y-direction and the width direction of each sub-pixel 100se is set along the X-direction, and, while the ink jet head 622 is scanningly moved in the X-direction, the ink is jetted from the jet ports aiming at impact point targets set in the grid-form regions defined by the row banks 122X and the column banks 522Y. In FIG. 7B, the target positions to which the ink for red gaps 522zR is to be applied are indicated in the regions of the red sub-pixels 100seR.

It is to be noted, however, that this ink applying method differs from the above-mentioned ink applying method in that, of the plurality of jet ports 624d1 possessed by the ink jet head 622, only those jet ports which pass over the regions between the row bank 122X and the row bank 122X are used, whereas those jet ports (the jet ports given the mark x in FIG. 7B) which pass over the regions of the row banks 122X are normally not used. In the example illustrated in FIG. 7B, seven impact point targets are set in each sub-pixel, and ink droplets are jetted from seven jet ports 624d1.

(5) Formation of Hole Transport Layer 121

The hole transport layers 121 are formed on the upper layers 120B of the exposed hole injection layers 120 formed in the gaps 522z defined by the column banks 522Y inclusive of the regions over the row banks 122X (FIG. 6C). The formation of the hole transport layers 121 is carried out by using a wet process such as an ink jet method or gravure printing, and applying the inks containing a constituent material to the inside of the gaps 522z defined by the column banks 522Y, followed by volatilizing off the solvent. Alternatively, the formation is conducted by performing baking. The method of applying inks for forming the hole transport layers 121 to the inside of the gaps 522z is the same as that in forming the upper layers 120B described above.

The hole transport layer 121R is equivalent in thickness to the hole transport layer 121G or the hole transport layer 121B. Therefore, the amounts of the respective inks to be applied to the inside of the gaps 522zR, 522zG and 522zB are the same. Accordingly, after the amount of the inks to be jetted from the nozzles to the inside of the gaps 522zR, 522zG and 522zB is set, operations of applying the inks sequentially to the gap for a first color on a single substrate, to the adjacent gap for a second color and to the adjacent gap for a third color are repeated, whereby the inks are continuously applied to the whole part of the gaps for the three colors on the single substrate.

Alternatively, the hole transport layers 121 may be formed by a method in which films of a metal (for example, tungsten) are deposited by sputtering, then baking is conducted to cause oxidation of the metallic films, after which the films are patterned on a pixel basis by use of photolithography and etching.

(6) Formation of Light-Emitting Layer 123

The light-emitting layer 123 and the electron transport layer 124 are stackedly formed in each gap 522z defined by the column banks 522Y, sequentially from the hole transport layer 121 side.

Figure 6D:
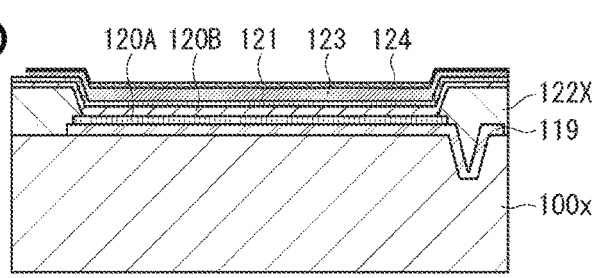

The formation of the light-emitting layers 123 is carried out by applying the inks containing a constituent material to the inside of the gaps 522z defined by the column banks 522Y by an ink jet method, followed by baking. Specifically, in this step, an ink 123R1, 123G1 or 123B1 containing a material for an organic light-emitting layer for one of R, G and B is charged into the gaps 522z to be sub-pixel formation regions by an ink jet method, drying the charged ink under a reduced pressure, and subjecting the ink to a baking treatment, to form the light-emitting layers 123R, 123G or 123B (FIG. 6D). In this case, in applying the ink for the light-emitting layer 123, first, application of a solution for forming the light-emitting layer 123 is conducted by use of a liquid droplet jetting apparatus. Steps of first applying the ink for forming one of the red light-emitting layer 123R, the green light-emitting layer 123G and the blue light-emitting layer 123B to the substrate 100x, then applying the ink for another color to the substrate 100x and applying the ink for a third color to the substrate 100x are conducted repeatedly, whereby the inks for the three colors are sequentially applied. By this, the red light-emitting layers 123R, the green light-emitting layers 123G and the blue light-emitting layers 123B are formed on the substrate 100x in the manner of being repeatedly juxtaposed in the horizontal direction of the paper surface of the figure. The details of the method of applying the inks for the light-emitting layers 123 to the inside of the gaps 522z are the same as those in the method in forming the upper layers 120B described above.

The methods for forming the upper layer 120B of the hole injection layer 120, the hole transport layer 121 and the light-emitting layer 123 are not limited to the above-described. The dropping or application of the inks may be conducted by other methods than the ink jet method and the gravure printing. Thus, there may be used such known methods as a dispenser method, a nozzle coating method, a spin coating method, intaglio printing, and relief printing.

(7) Formation of Electron Transport Layer 124

Figure 6E:
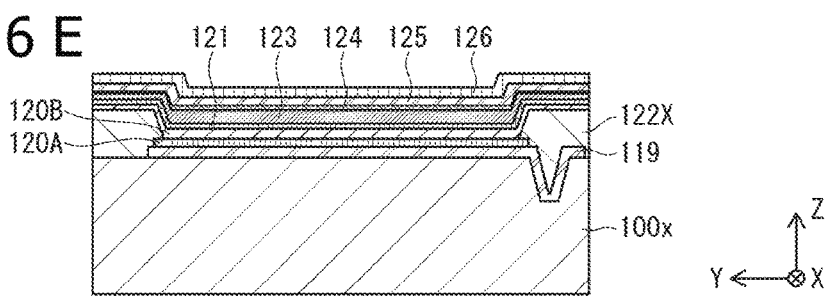

Next, the electron transport layer 124 is formed by vacuum deposition or the like. Thereafter, the counter electrode layer 125 and the sealing layer 126 are sequentially stackedly formed in such a manner as to cover the electron transport layer 124 (FIGS. 6D and 6E). The counter electrode layer 125 and the sealing layer 126 can be formed by use of chemical vapor deposition (CVD), sputtering or the like.

(8) Formation of Counter Electrode Layer 125 and Sealing Layer 126

As illustrated in FIG. 6E, the counter electrode layer 125 and the sealing layer 126 are sequentially stackedly formed in such a manner as to cover the electron transport layer 124 in the form of a solid film in the gaps 522z and over the column banks 522Y. The counter electrode layer 125 and the sealing layer 126 can be formed by CVD, sputtering or the like.

(9) Formation of CF Substrate 131

Now, an example of a process for manufacturing the CF substrate 131 will be described below, referring to FIGS. 8A to 8D.

Figure 8A:
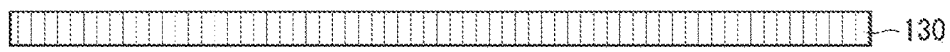
FIGS. 8A to 8D are schematic sectional views showing states in steps of manufacture of a color filter (CF) substrate in manufacture of the organic EL display panel.
Figure 8B:
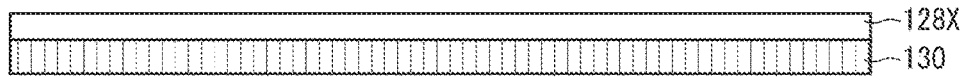
Figure 8C:
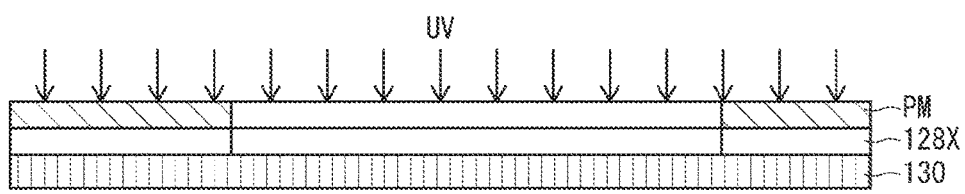
Figure 8D:
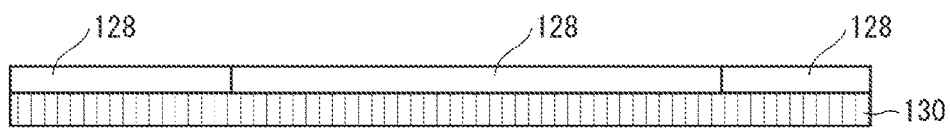
Figure 8D:
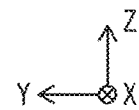

A transparent upper substrate 130 is prepared (FIG. 8A). Next, a paste 128X obtained by dispersing in a solvent a material for a color filter layer 128 (for example, G) containing a UV-curing resin component as a main component is applied to a surface of the upper substrate 130 (FIG. 8B), and the solvent is removed to a certain extent, after which a predetermined pattern mask PM2 is placed thereon, and irradiation with UV rays is conducted (FIG. 8C). Thereafter, curing is conducted, and the pattern mask PM2 and the uncured paste 128X are removed by development, whereon a color filter layer 128(G) is formed (FIG. 8D). The steps of FIGS. 8B to 8D are similarly repeated for color filter materials for each color, whereby color filter layers 128(R) and 128(B) are formed. Note that commercially available color filter products may be used in place of the paste 128X.

In this way, the CF substrate 131 is formed.

(10) Lamination of CF Substrate 131 and Back Panel

Figure 9A:
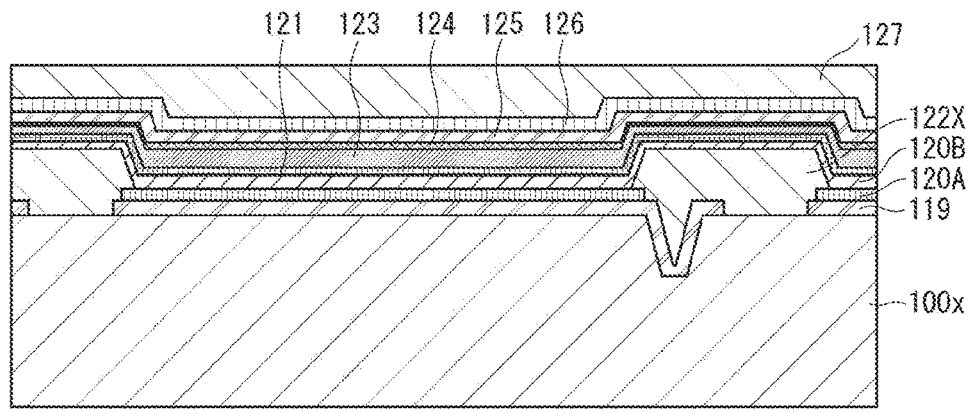
FIGS. 9A and 9B are schematic sectional views taken along the same position as line A-A of FIG. 3, showing a state in a lamination step of the CF substrate and a back panel in manufacture of the organic EL display panel.

Next, a material for the bonding layer 127 containing a UV-curing type resin such as acrylic resin, silicone resin and epoxy resin as a main component is applied to a back panel including layers ranging from the substrate 100x to the sealing layer 126 (FIG. 9A).

Figure 9B:
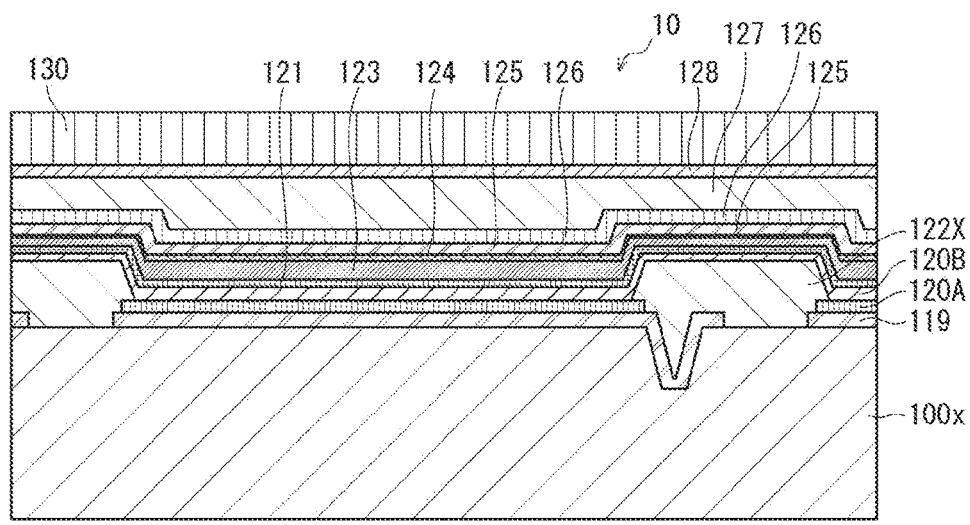
Figure 9B:
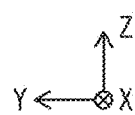

Subsequently, the thus applied material is irradiated with UV rays, thereby laminating the back panel and the CF substrate 131 on each other in a state where the relative positions of the substrates are matched. In this case, care should be taken to ensure that gas does not enter between the substrates. Thereafter, the substrates are baked to complete a sealing step, whereon the display panel 10 is completed (FIG. 9B).

6. In Regard of Effects of Display Panel 10

The effects obtained from the display panel 10 will be described below.

6.1 Realization of Hole Injection Properties Suited to Light-Emitting Layers 123R, 123G and 123B The present inventors have experimentally found out that in the case where a hole injection layer 120 includes a lower layer 120A of tungsten oxide obtained by forming a film by vapor phase growth and baking the film and an upper layer 120B obtained using a coating film of an organic polymer solution of a conductive polymer material such as PEDOT, a variation in the film thickness of the upper layer 120B leads to variations in hole injection property and driving voltage.

On the other hand, in relation to RGB sub-pixels differing in the carrier density required according to the material characteristics of the light-emitting layers destined to emit light, if a film thickness of a hole injection layer at which the carrier density for the sub-pixel requiring the highest carrier density of the RGB sub-pixels is obtained is set and the film thickness of the hole injection layer is set to be the same for the RGB sub-pixels, then the element would be driven at a relatively excessive voltage in one or some of the RGB sub-pixels. As a result, the element life enhancing effect intended to be obtained by the two-layer structure of the hole injection layer cannot be sufficiently obtained, and it is assumed that the element life is deteriorated and the element life on a unit pixel basis is lowered.

In view of this, the present inventors made investigations and have found out that it is preferable to adopt a configuration wherein a hole injection layer 120 including a lower layer 120A of tungsten oxide and an upper layer 120B obtained by use of a coating film of an organic polymer solution of a conductive polymer material such as PEDOT is used, and the thickness of the upper layer 120BR is set to be greater than the thicknesses of the upper layer 120BB and the upper layer 120BG.

Specifically, as a result of the present inventors' investigations, it has been found preferable that in the display panel 10 the thickness of the upper layer 120BB is more than 0 nm and not more than 25 nm, the thickness of the upper layer 120BG is more than 0 nm and not more than 30 nm, and the thickness of the upper layer 120BR is 20 to 50 nm.

By this configuration, it is ensured that holes in amounts corresponding to the carrier densities required for driving according to the materials used for the luminescent colors are supplied to the light-emitting layers 123R, 123G and 123B from the hole injection layers 120R, 120G and 120B, respectively, and driving voltages differing according to the film thicknesses of the hole injection layers 120R, 120G and 120B are impressed respectively on the light-emitting layers 123R, 123G and 123B. For this reason, the light-emitting layers 123R, 123G and 123B are driven at optimum voltages corresponding to the carrier densities required for driving on a luminescent color basis, so that a sufficient emission luminance can be obtained in the light-transmitting layer for each color. In addition, a situation in which an excessive voltage is impressed on one or some of the RGB sub-pixels is obviated, and an excessive driving voltage in excess of the necessary carrier density can be inhibited from being impressed on any of the light-emitting layers 123R, 123G and 123B. Consequently, as compared to the case where the thickness of the upper layer 120BR is set equivalent to the thicknesses of the upper layer 120BB and the upper layer 120BG, it is possible to reduce the driving voltage to be impressed on the light-emitting layers 123G and 123B and to restrain a lowering in the element life of the light-emitting layers 123G and 123B.

6.2 Effects on Manufacturing Cost and Productivity

It is desirable that the light-emitting layers 123R, 123G and 123B are supplied with holes in amounts corresponding to the carrier densities required for driving according to the materials used on a luminescent color basis, and, in this connection, it has been found by the present inventors' investigations that a variation in the film thickness of the lower layer 120A made of tungsten oxide leads to variations in hole injection property and driving voltage according to the film thickness. However, since the lower layer 120A of tungsten oxide is formed through film formation by vapor phase growth, in order to obtain different film thicknesses of the lower layers 120A in the light-emitting layers 123R, 123G and 123B on a luminescent color basis, it is necessary to separately form and pattern the films for the lower layers 120AR, 120AG and 120AB by a shadow mask method using precision shadow masks provided with openings only in the regions of sub-pixels for each color. In this case, since a vapor deposition material is deposited on the whole part of the mask inclusive of the openings, the material loss is large, which would cause a rise in cost. In addition, highly accurate aligning of the openings of the precision mask to the banks in the regions of sub-pixels for each color would cause a lowering in productivity.

On the other hand, the upper layer 120B is formed by use of an applying system such as an ink jet method. According to the applying system, by varying the amount of the ink jetted from the nozzles, control of film thickness according to the film formation parts can be comparatively easily achieved even in the case of forming films on the same substrate. As a result, the rise in cost due to material loss and the lowering in productivity due to highly accurate aligning of the precision masks as above-mentioned can be obviated.

6.3 Realization of Optical Resonator Structure

In the organic EL display panel, a resonator structure is adopted for adjustment of light extraction efficiency. As the resonator structure, there is a form wherein a pixel electrode layer 119 having a light reflecting property and a counter electrode layer 125 having a light transmitting property are used, a light-emitting layer 123 is arranged in spacings t4B, t4G and t4R (FIG. 5) between the pixel electrode layer 119 and the counter electrode layer 125, and one or more functional layers are arranged between the pixel electrode layer 119 or the counter electrode layer 125 and the light-emitting layer 123.

[In Regard of Optical Film Thickness of Each Layer and Optical Resonator Structure]

Figure 10:
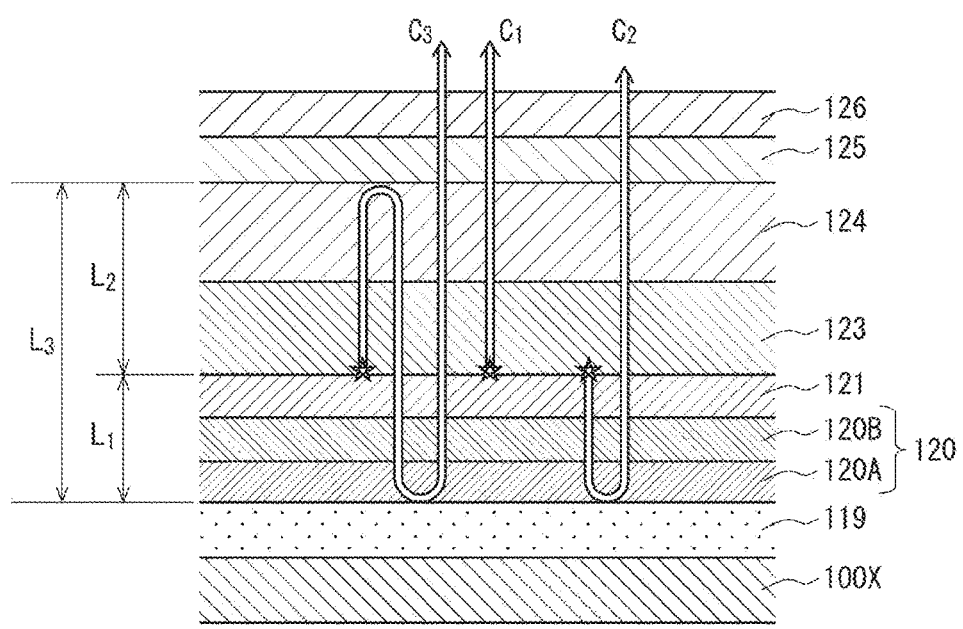
FIG. 10 is an illustration for explaining light interferences in an optical resonator structure formed in the organic EL display panel.

FIG. 10 is an illustration for explaining light interference in an optical resonator structure of the display panel 10 according to the present embodiment. Referring to this figure, an element section corresponding to one sub-pixel 100se will be described.

In the optical resonator structure of the sub-pixel 100se of the organic EL element 100, light is emitted from the light-emitting layer 123, specifically, from the vicinity of the interface between the light-emitting layer 123 and the hole transport layer 121, to be transmitted through each of layers. At the interfaces between the layers, part of the light is reflected, whereby interference of light is generated. Main examples of the interference will be shown below.

(1) A first optical path C1 wherein part of the light emitted from the light-emitting layer 123 and passing toward the counter electrode layer 125 side is transmitted through the counter electrode layer 125 and emitted to the exterior of the light-emitting element, and a second optical path C2 wherein part of the light passing from the light-emitting layer 123 toward the pixel electrode layer 119 side is reflected by the pixel electrode layer 119, is thereafter transmitted through the light-emitting layer 123 and the counter electrode layer 125 and is emitted to the exterior of the light-emitting element, are formed. Then, interference occurs between the direct light and the reflected light.

An optical film thickness L1 shown in FIG. 10 corresponds to the difference in optical distance between the first optical path C1 and the second optical path C2. The optical film thickness L1 is a total optical distance (the product of film thickness and refractive index; nm) of the hole injection layer 120 and the hole transport layer 121 which are sandwiched between the light-emitting layer 123 and the pixel electrode layer 119.

(2) There is also formed a third optical path C3 wherein part of the light passing from the light-emitting layer 123 toward the counter electrode layer 125 side is reflected by the counter electrode layer 125, is further reflected by the pixel electrode layer 119 and is thereafter emitted to the exterior of the light-emitting element. Interference occurs between the light passing along the third optical path C3 and the light passing along the first optical path C1.

The difference in optical distance between the second optical path C2 and the third optical path C3 corresponds to an optical film thickness L2 shown in FIG. 10. The optical film thickness L2 is a total optical distance of the light-emitting layer 123 and the electron transport layer 124.

(3) Interference is also generated between the light passing along the third optical path C3 and the light passing along the first optical path C1. The difference in optical distance between the first optical path C1 and the third optical path C3 corresponds to an optical film thickness L3 shown in FIG. 10. The optical film thickness L3 is the sum of the optical film thickness L1 and the optical film thickness L2 (L3=L1+L2). The optical film thickness L3 is the total optical distance of the hole injection layer 120, the hole transport layer 121, the light-emitting layer 123 and the electron transport layer 124 which are sandwiched between the pixel electrode layer 119 and the counter electrode layer 125.

Normally, in a resonator structure, optical film thicknesses are adjusted such that the light extraction efficiency is maximized. The optical film thickness L1 between the light-emitting layer 123 and the pixel electrode layer 119, the optical film thickness L2 between the light-emitting layer 123 and the counter electrode layer 125, and the optical film thickness L3 between the pixel electrode layer 119 and the counter electrode layer 125 are set in such a manner that the lights passing along the above-mentioned optical paths intensify one another by interference, leading to an enhanced light extraction efficiency.

These basic light interferences similarly occur in the blue sub-pixels 100seB, the green sub-pixels 100seG and the red sub-pixels 100seR.

Then, by adjusting the distance between the counter electrode layer 125 and the pixel electrode layer 119 with the light-emitting layers 123R, 123G and 123B sandwiched therebetween in such a manner that the direct light passing along the first optical path C1 and the reflected light passing along the second optical path C2 intensify each other by an interference effect, it is possible to enhance the light extraction efficiency of the display panel 10.

Of the above-mentioned three kinds of light interferences, the interference between the direct light passing through the first optical path C1 and the reflected light passing through the second optical path C2 shown in (1) above has the most predominant influence on the outgoing light. Therefore, an adjustment of the optical film thickness L1 corresponding to the difference in optical distance between the first optical path C1 and the second optical path C2 will be described below.

The present inventors have confirmed that in the case where the film thickness of the hole transport layer 121 is appropriately set to adjust light extraction efficiency, the driving voltage required for obtaining a predetermined current density increases as the film thickness increases.

In addition, as above-mentioned, the hole injection layer 120 has a configuration wherein the film thicknesses of the hole injection layers 120R, 120G and 1206 are set to be different on the basis of luminescent colors of the light-emitting layers 123R, 123G and 1236, whereby it is made possible to achieve supplies of holes corresponding to the carrier densities suited to the light-emitting layers 123R, 123G and 1236. In view of this, the present inventors considered that in regard of adjustment of the optical film thickness L1, also, it is preferable to appropriately set the film thickness of the hole injection layer 120 to thereby adjust the light extraction efficiency.

When it is intended to realize a resonator structure by adjusting the film thickness of the lower layer 120A formed from tungsten oxide, of the hole injection layer 120, a problem is generated as above-mentioned. Specifically, in order that the thickness of the tungsten layer formed in a film form by vapor phase growth differs on the basis of each of the RGB sub-pixels, it is necessary to separately form and pattern the films for the lower layers 120AR, 120AG and 120AB by use of shadow masks opened only in the regions of sub-pixels for each color, with the result of an increase in cycle time on a manufacturing process basis and an increase in mass production cost.

For this reason, in the present embodiment, the adjustment of the optical film thickness L1 is conducted by adjustment of the film thickness of the upper layer 120B of the hole injection layer 120.

Specifically, based on optical simulation, it is preferable that the film thicknesses of the hole injection layers 120 for R, G and B colors are adjusted to within the range of 5 to 70 nm.

Figure 11A:
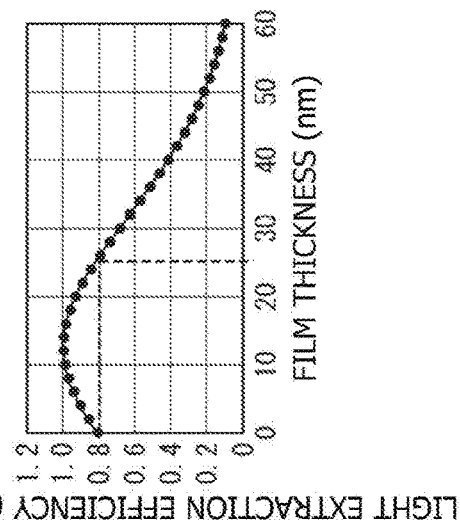
FIGS. 11A to 11C are diagrams showing the results of optical simulation indicative of the relation between the thickness of an upper layer of each of RGB colors and light extraction efficiency in the organic EL display panel.
Figure 11B:
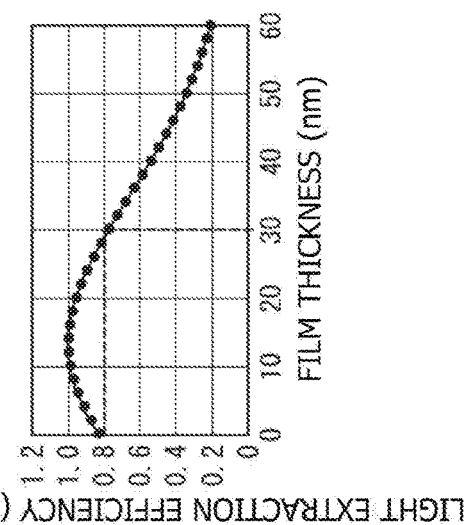
Figure 11C:
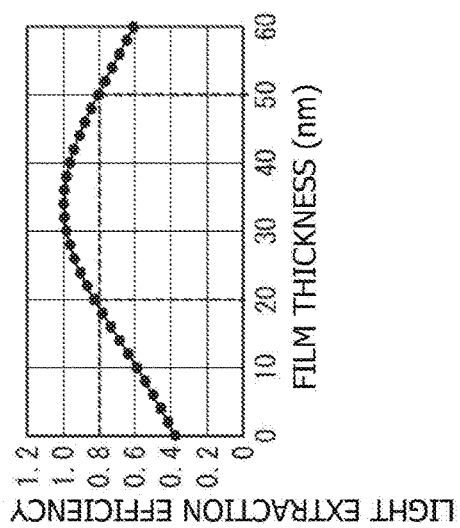

FIGS. 11A to 11C are diagrams showing the results of optical simulation indicative of the relation between the thickness of an upper layer 120B for each of RGB colors and light extraction efficiency in the organic EL display panel 10, wherein FIG. 11A shows the relation between the thickness of the upper layer 120BR and light extraction efficiency, FIG. 11B shows the relation between the thickness of the upper layer 120BG and light extraction efficiency, and FIG. 11C shows the relation between the thickness of the upper layer 120BB and light extraction efficiency. Based on the results shown, the film thicknesses of the first, second and third upper layers 120B at which the light extraction efficiency for each of RGB colors becomes not less than 80% of a maximum value were calculated as preferable ranges. As a result, it was found preferable that the film thickness of the upper layer 120BR is 20 to 50 nm, the film thickness of the upper layer 120BG is more than 0 nm and not more than 30 nm, and the film thickness of the upper layer 120BB is more than 0 nm and not more than 25 nm. In addition, as a result of similar investigations, it was found preferable that the film thicknesses of lower layers 120AR, 120AG and 120AB are 5 to 20 nm and are equal.

This configuration ensures that in the resonator structure, the film thicknesses of the upper layers 120B of the hole injection layers 120 can be easily set appropriately in such a manner that the optical film thickness L1 is adjusted to an optical film thickness that gives a maximum light extraction efficiency, and, therefore, the light extraction efficiency can be enhanced.

Note that the adjustment of the optical film thickness L2 that influences the light interference mentioned in (2) above is conducted by adjusting the film thickness of the light-emitting layer 123. Besides, the adjustment of the optical film thickness L3 that influences the light interference mentioned in (3) above is conducted by adjusting the film thickness of the light-emitting layer 123, like in the adjustment of the optical film thickness L2, in addition to the adjustment of the film thicknesses of the upper layers 120B of the hole injection layers 120 described above. In other words, taking into account the film thicknesses of the upper layers 120B of the hole injection layers 120 determined for adjustment of the optical film thickness L1, the film thickness of the light-emitting layer 123 is adjusted for adjustment of both the optical film thickness L2 and the optical film thickness L3.

Specifically, based on optical simulation, it is preferable that the film thickness of the light-emitting layer 123R is 70 to 130 nm, the film thickness of the light-emitting layer 123G is 60 to 100 nm, and the film thickness of the light-emitting layer 123B is 20 to 60 nm.

[In Regard of Reduction in Driving Voltage]

Due to the differences in luminescent wavelength on a color basis, the optically optimum inter-electrode distance is the longest for the red sub-pixels and the shortest for the blue sub-pixels. If the hole injection layers for the different colors are the same in film thickness, the optical path length is to be adjusted by the light-emitting layers; in this case, naturally, it is necessary to make the red light-emitting layer thick, resulting in a raised driving voltage. On the other hand, in the organic EL display panel 10, the upper layer of the hole injection layer for the red sub-pixels is formed to be thicker than the upper layers for the green sub-pixels and blue sub-pixels, whereby the film thickness of the light-emitting layer for the red sub-pixels can be made relatively smaller, so that the driving voltage can be made low as compared to the case where the optical path length is adjusted by the film thickness of the light-emitting layer.

Therefore, in the organic EL display panel 10, the resonator structure is based on a configuration wherein one or more of the film thicknesses of the upper layers 120BR, 120BG and 120BB of the hole injection layers 120 are set different from the others, whereby the optical film thickness in sub-pixels 100se for each color is adjusted to the vicinity of an optical film thickness that gives a maximum light extraction efficiency. According to such a configuration, the voltage required for driving the pixels 100e can be lowered as compared to the case where the optical path length is adjusted by the film thickness of the light-emitting layer.

6.4 Improvement of Element Life

Figure 12:
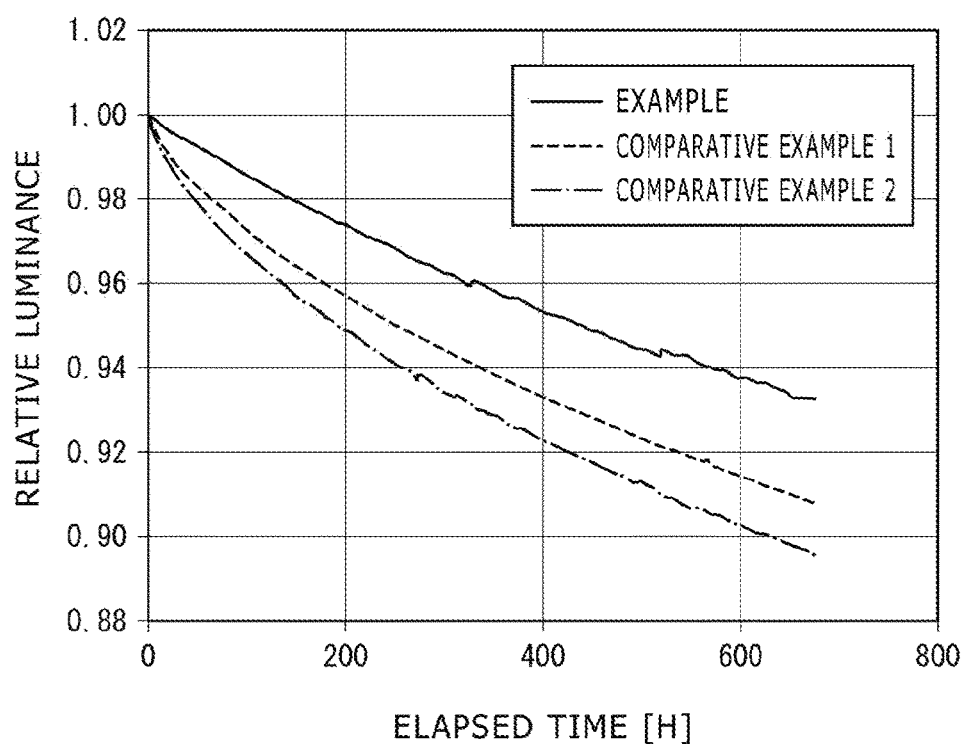
FIG. 12 shows test results of life characteristic of the organic EL display panel.

Test results of life characteristic of the organic EL display panel 10 will be described. FIG. 12 shows the test results of the life characteristic. This is a diagram showing the relation between elapsed time and relative luminance of an organic EL element section corresponding to a green sub-pixel 100seG when an organic EL element was driven at a current density of 3.4 mA/cm2, for Example of the organic EL display panel 10, Comparative Example 1 wherein the hole injection layer in the configuration of the organic EL display panel 10 was replaced by a single layer of a tungsten oxide film, and Comparative Example 2 wherein the hole injection layer in the configuration of the organic EL display panel 10 was replaced by a single layer of a coating film formed from an organic polymer solution of a conductive polymer material.

As shown in FIG. 12, over the whole range of elapsed time of 0 to 680 hours of the test, the values of relative luminance obtained in Example, Comparative Example 1 and Comparative Example 2 decreased in this order. For example, at the elapsed time of 680 hours, the relative luminance in Example was approximately 2.5% higher than that in Comparative Example 1, and approximately 4% higher than that in Comparative Example 2; thus, it is seen that lowering in relative luminance is slight in Example. Besides, at the elapsed time of 680 hours, the lowering rate of relative luminance in Example was reduced to approximately 74% of that in Comparative Example 1, and was reduced to approximately 65% of that in Comparative Example 2; thus, it is seen that lowering in relative luminance is restrained in Example.

From these results, it was confirmed that in Example of the organic EL display panel 10, the lowering in relative luminance attendant on driving is small as compared to Comparative Examples 1 and 2 wherein the hole injection layer composed of a single layer was used. It was also confirmed that the organic EL display panel 10 had an improved element life as compared to Comparative Examples 1 and 2.

In other words, it was confirmed that, by composing the hole injection layer from a plurality of layers, it is possible to improve element life as compared to the case where the hole injection layer is composed of a single layer.

As above-mentioned, the thickness of the upper layer 120BR was set greater than the thicknesses of the upper layer 120BB and the upper layer 120BG, whereby the driving voltages impressed on the light-emitting layers 123G and 123B could be lowered, the lowering in element life of the light-emitting layers 123G and 123B could be restrained, and the overall element life could be improved, as compared to the case where the thickness of the upper layer 120BR is set equivalent to the thicknesses of the upper layer 120BB and the upper layer 120BG. It is considered that since the light-emitting layers 123R, 123G and 123B are driven by optimum voltages corresponding to the carrier densities required for driving on a luminescent color basis, application of an excessive driving voltage in excess of the necessary carrier density to any of the light-emitting layers 123R, 123G and 123B can be restrained.

7. Summary

As has been described above, the display panel 10 according to the present embodiment has a configuration wherein the first hole injection layers 120B are provided in the regions of blue sub-pixels 100seB on the substrate 100x, the second hole injection layers 120G are provided in the regions of green sub-pixels 100seG on the substrate 100x, and the third hole injection layers 120R are provided in the regions of red sub-pixels 100seR on the substrate 100x, the first hole injection layer 120B includes the first lower layer 120AB made of a metallic oxide and the first upper layer 120BB made of an organic material stacked on the first lower layer 120AB, the second hole injection layer 120G includes the second lower layer 120AG made of a metallic oxide and the second upper layer 120BG made of an organic material stacked on the second lower layer 120AG, and the third hole injection layer 120R includes the third lower layer 120AR made of a metallic oxide and the third upper layer 120BR made of an organic material stacked on the third lower layer 120AR, the third upper layer 120BR being greater in thickness than the first upper layer 120BB and the second upper layer 120BG.

By this configuration, emission luminance and light extraction efficiency of the organic EL element can be enhanced, and element life can be improved.

In addition, a configuration may be adopted wherein the thickness of the first upper layer 120BB is more than 0 nm and not more than 25 nm, the thickness of the second upper layer 120BG is more than 0 nm and not more than 30 nm, and the thickness of the third upper layer 120BR is 20 to 50 nm.

According to this configuration, the light-emitting layers 123R, 123G and 123B are driven by optimum voltages corresponding to the carrier densities required for driving on a luminescent color basis, and, therefore, sufficient emission luminance can be obtained at the light-emitting layers for each color.

In addition, the driving voltages to be impressed on the light-emitting layers 123G and 123B can be lowered, and lowering in element life of the light-emitting layers 123G and 123B can be suppressed, as compared to the case where the thickness of the third upper layer 120BR is set equivalent to the thicknesses of the first upper layer 120BB and the second upper layer 120BG.

Further, in the resonator structure, the film thickness of the upper layer 120B of the hole injection layer 120 can be easily set appropriately in such a manner that the optical film thickness L1 is adjusted to an optical film thickness that gives a maximum light extraction efficiency, and, therefore, the light extraction efficiency can be enhanced.

Besides, the metallic oxide may include an oxide of tungsten (W). In addition, the first lower layer 120AB, the second lower layer 120AG and the third lower layer 120AR may be the same in thickness. Besides, the thicknesses of the first lower layer 120AB, the second lower layer 120AG and the third lower layer 120AR may be 5 to 20 nm.

According to such a configuration, the upper layers 120B are formed by use of an applying system such as an ink jet method. The applying system makes it possible to comparatively easily control the film thickness according to the film formation parts even in the case of forming films on the same substrate, by varying the amount of the ink jetted from nozzles. Therefore, the rise in cost due to material loss and the lowering in productivity attendant on highly accurate aligning of precision masks as above-mentioned can be obviated.

Modifications

While the display panel 10 according to the present embodiment has been described above, the present disclosure is not to be limited to the above embodiment, so long as the essential and characteristic constitutional elements thereof are secured. For instance, modes obtained when the embodiment is subjected to various modifications conceived by those skilled in the art, and modes realized by arbitrarily combining the constitutional elements and functions in the embodiment without departing from the scope of the present disclosure, are also embraced by the present disclosure. As an example of such possible modes, some modifications of the display panel 10 will be described below.

In the display panel 10, the light-emitting layers 123 extend continuously in the column direction over the row banks 122X. However, in the above-mentioned configuration, a configuration may be adopted wherein the light-emitting layers 123 extend intermittently on a pixel basis over the row banks 122X.

In the display panel 10, the luminescent colors of the light-emitting layers 123 of the sub-pixels 100se arranged in the gaps 522z between the column banks 522Y adjacent to each other in the row direction are different from one another, whereas the luminescent colors of the light-emitting layers 123 of the sub-pixels 100se arranged in the gaps between the row banks 122X adjacent to each other in the column direction are the same. However, in the above-mentioned configuration, a configuration may be adopted wherein the luminescent colors of the light-emitting layers 123 of the sub-pixels 100se adjacent to each other in the row direction are the same, whereas the luminescent colors of the light-emitting layers 123 of the sub-pixels 100se adjacent to each other in the column direction are different. In addition, a configuration may also be adopted wherein both the luminescent colors of the light-emitting layers 123 of the sub-pixels 100se adjacent to each other in the row direction and the luminescent colors of the light-emitting layers 123 of the sub-pixels 100se adjacent to each other in the column direction are different.

While the pixels 100e in the display panel 10 according to the present embodiment include three kinds of pixels, namely, red pixels, green pixels and blue pixels, this is not limitative of the present disclosure. For example, the light-emitting layers may be of only one kind, or may be of four kinds that emit light in red, green, blue and yellow.

In addition, while the pixels 100e are arranged in a matrix pattern in the above embodiment, this configuration is not restrictive of the present disclosure. For example, a configuration may be adopted with similar effects wherein let the spacing between pixel regions be one pitch, then the pixel regions in the adjacent gaps are deviated from each other by half a pitch in the column direction. In display panels being progressively enhanced in resolution, it is difficult to visually discriminate a slight extent of deviations in the column direction; even if differences in film thickness are aligned on a straight line form (or in a staggered pattern) with a certain width, they look like a belt form visually. Therefore, even in such a case, by restraining differences in luminance from being aligned in a staggered pattern, it is possible to enhance display quality of the display panel.

Besides, while the pixel electrode layers 119 are arranged in all the gaps 522z in the display panel 10, this configuration is not limitative of the present disclosure. For example, the gaps 522z in which the pixel electrode layers 119 are not formed may be present, for forming bus bars or the like.

In addition, while the hole injection layer 120, the hole transport layer 121, the light-emitting layer 123 and the electron transport layer 124 are present between the pixel electrode layer 119 and the counter electrode layer 125 in the above embodiment, this configuration is not restrictive of the present disclosure. For example, there may also be adopted a configuration wherein the hole injection layer 120, the hole transport layer 121 and the electron transport layer 124 are not used and wherein only the light-emitting layer 123 is present between the pixel electrode layer 119 and the counter electrode layer 125. In addition, there may also be adopted, for example, a configuration wherein a hole injection layer, a hole transport layer, an electron transport layer, an electron injection layer and the like are provided, or a configuration wherein a plurality of ones or all of these layers are simultaneously provided. Besides, all of these layers may not necessarily be made of an organic compound but may be made of an inorganic material or the like.

In addition, while a wet type film forming process such as a printing method, a spin coating method and an ink jet method is used as a method for forming the light-emitting layers 123 in the above embodiment, this configuration is not restrictive of the present disclosure. For example, a dry type film forming process such as a vacuum deposition method, an electron beam evaporation method, a sputtering method, a reactive sputtering method, an ion plating method, and a vapor phase growth method can also be used. Further, as materials for the constituent parts, known materials can be appropriately adopted.

While a configuration wherein the pixel electrode layer 119 as anode is arranged at a lower portion of the EL element section and the pixel electrode layer 119 is connected to the source electrode of the TFT has been used in the above embodiment, there can also be adopted a configuration wherein the counter electrode layer is arranged at a lower portion of the EL element section and the anode is arranged at an upper portion of the EL element section. In this case, the cathode arranged at the lower portion is connected to the drain of the TFT.

In addition, while a configuration wherein two transistors Tr1 and Tr2 are provided for one sub-pixel 100se has been adopted in the above embodiment, this configuration is not limitative of the present disclosure. For example, only one transistor may be provided for one sub-pixel, or three or more transistors may be provided for one sub-pixel.

Further, while a top emission type EL display panel has been described as an example in the above embodiment, this is not restrictive of the present disclosure. For example, the present disclosure may also be applied to a bottom emission type display panel. In that case, the constitutional elements can be changed appropriately.

<<Supplement>>

The above-described embodiments show preferred specific examples of the mode for carrying out the present disclosure. The numerical values, shapes, materials, constituent elements, layout positions and connection modes of the constituent elements, steps, order of the steps, and the like shown in the embodiments are mere examples, and are not intended to limit the present disclosure. In addition, of the constituent elements in the embodiments, the steps which are not described in the independent claims showing the most generic concepts of the present disclosure are explained as optional constituent elements that constitute more preferred modes.

Besides, the order in which the above-mentioned steps are carried out is intended to specifically explain the present disclosure, and other orders than the above-described may also be adopted. In addition, part of the steps may be carried out simultaneously (concurrently) with other steps.

Besides, for easy understanding of the present disclosure, the reduction scales of the constituent elements in the drawings shown in the above embodiments may not reflect the actual sizes. In addition, the present disclosure is not limited by the description of the above embodiments, and appropriate modifications are possible without departing from the scope of the present disclosure.

At least some of the functions in the above embodiments and modifications may be combined together.

Further, various modifications obtained by changing the embodiments in a scope conceived by those skilled in the art are also embraced by the present disclosure.

The organic EL display panel and organic EL display apparatus according to the present disclosure can be widely used for such apparatuses as television sets, personal computers, mobile phones, etc. and other electronic apparatuses that have a display panel.

What is claimed is:

1. An organic electroluminescence display panel comprising:
    a plurality of pixels, wherein each pixel of the plurality of pixels comprises a blue sub-pixel, a green sub-pixel, and a red sub-pixel,
    a substrate;
    a first pixel electrode layer, a first hole injection layer, a first hole transport layer, and a blue organic light-emitting layer provided in regions of the blue sub-pixel over the substrate in this order from a side of the substrate;
    a second pixel electrode layer, a second hole injection layer, a second hole transport layer, and a green organic light-emitting layer provided in regions of the green sub-pixel over the substrate in this order from the side of the substrate;
    a third pixel electrode layer, a third hole injection layer, a third hole transport layer, and a red organic light-emitting layer provided in regions of the red sub-pixel over the substrate in this order from the side of the substrate; and
    a counter electrode layer over the blue organic light-emitting layer, the green organic light-emitting layer, and the red organic light-emitting layer,
    wherein the first hole injection layer includes a first lower layer made of a metallic oxide and a first upper layer made of an organic material on the first lower layer,
    wherein the second hole injection layer includes a second lower layer made of the metallic oxide and a second upper layer made of the organic material on the second lower layer, wherein the third hole injection layer includes a third lower layer made of the metallic oxide and a third upper layer made of the organic material on the third lower layer, and wherein a thickness of the third upper layer is greater than a thickness of each of the first upper layer and the second upper layer.

2. The organic electroluminescence display panel according to claim 1, wherein the metallic oxide includes an oxide of tungsten.

3. The organic electroluminescence display panel according to claim 1, wherein the thickness of the first upper layer is more than 0 nm and not more than 25 nm, wherein the thickness of the second upper layer is more than 0 nm and not more than 30 nm, and wherein the thickness of the third upper layer is 20 nm to 50 nm.

4. The organic electroluminescence display panel according to claim 1, wherein the first lower layer, the second lower layer, and the third lower layer have equal thickness.

5. The organic electroluminescence display panel according to claim 1, wherein each of the thickness of the first lower layer, the thickness of the second lower layer, and the thickness of the third lower layer is 5 nm to 20 nm.

6. The organic electroluminescence display panel according to claim 1, wherein the organic material includes a mixture of polythiophene and polystyrenesulfonic acid.

7. The organic electroluminescence display panel according to claim 1, further comprising:

a bank over the substrate that partitions the regions of the blue sub-pixel, the green sub-pixel, and the red sub-pixel, wherein the bank comprises:

a plurality of column banks over row-directionally outer edges of the first pixel electrode layer, the second pixel electrode layer, and the third pixel electrode layer and over the substrate located between the row-directionally outer edges; and a plurality of row banks over column-directionally outer edges of the first pixel electrode layer, the second pixel electrode layer, and the third pixel electrode layer and over the substrate located between the column-directionally outer edges.

8. The organic electroluminescence display panel according to claim 7, wherein the first upper layer, the second upper layer, and the third upper layer are arranged continuously in a column direction over the plurality of row banks.

9. The organic electroluminescence display panel according to claim 8, wherein the blue organic light-emitting layer, the green organic light-emitting layer, and the red organic light-emitting layer are arranged continuously in the column direction over the plurality of row banks.

10. The organic electroluminescence display panel according to claim 7, wherein the first hole transport layer is in a first gap between adjacent column banks of the plurality of column banks over the first hole injection layer, wherein the second hole transport layer is in a second gap between the adjacent column banks over the second hole injection layer, and wherein the third hole transport layer is in a third gap between the adjacent column banks over the third hole injection layer.

11. The organic electroluminescence display panel according to claim 10, wherein the first hole transport layer, the second hole transport layer, and the third hole transport layer are arranged continuously in a column direction over the plurality of row banks.

* * * * *